US006817005B2

(12) United States Patent
Mason et al.

(10) Patent No.: US 6,817,005 B2
(45) Date of Patent: Nov. 9, 2004

(54) MODULAR DESIGN METHOD AND SYSTEM FOR PROGRAMMABLE LOGIC DEVICES

(75) Inventors: Jeffrey M. Mason, Eldorado Springs, CO (US); Steve E. Lass, Boulder, CO (US); Bruce E. Talley, Louisville, CO (US); David W. Bennett, Lafayette, CO (US)

(73) Assignee: Xilinx, Inc., San Jose, CA (US)

( * ) Notice: Subject to any disclaimer, the term of this patent is extended or adjusted under 35 U.S.C. 154(b) by 283 days.

(21) Appl. No.: 09/839,464

(22) Filed: Apr. 20, 2001

(65) Prior Publication Data

US 2001/0047509 A1 Nov. 29, 2001

Related U.S. Application Data

(60) Provisional application No. 60/207,631, filed on May 25, 2000.

(51) Int. Cl.[7] ................................ G06F 17/50
(52) U.S. Cl. ................... 716/16; 716/7; 716/8
(58) Field of Search ............... 716/16, 7, 8, 11, 716/18

(56) References Cited

U.S. PATENT DOCUMENTS

| | | | | |
|---|---|---|---|---|
| 4,646,266 A | * | 2/1987 | Ovshinsky et al. ......... 365/105 |
| 5,309,371 A | * | 5/1994 | Shikata et al. ............. 716/10 |
| 5,572,436 A | * | 11/1996 | Dangelo et al. ............ 716/18 |
| 5,757,658 A | | 5/1998 | Rodman et al. |
| 5,778,216 A | | 7/1998 | Venkatesh |
| 5,867,396 A | | 2/1999 | Parlour |
| 5,870,308 A | * | 2/1999 | Dangelo et al. ............ 716/18 |
| 6,026,226 A | | 2/2000 | Heile et al. |
| 6,035,106 A | * | 3/2000 | Carruthers et al. .......... 703/1 |
| 6,446,243 B1 | * | 9/2002 | Huang et al. .............. 716/7 |
| 2002/0188921 A1 | * | 12/2002 | Shau ........................ 716/16 |

FOREIGN PATENT DOCUMENTS

| WO | WO 98/37475 | 8/1998 |
|---|---|---|
| WO | WO 99/39288 | 8/1999 |

OTHER PUBLICATIONS

David Greenfield; Martin S. Won; Balaji Thurumalai, "Digital Systems Design Tools in the Era of Multimillion Gate Devices", Electronic Product Design, Feb. 2000, vol. 21, No. 2, pp. 31–32, and 34.

"The Programmable Logic Data Book", 1999, available from Xilinx, Inc., 2100 Logic Drive, San Jose, California 95124, pp. 3–5 through 3–10.

* cited by examiner

*Primary Examiner*—Eddie Lee
*Assistant Examiner*—Douglas W. Owens
(74) *Attorney, Agent, or Firm*—Edel M. Young

(57) ABSTRACT

In modular design flow, logic designers are able to partition a top-level logic design for a PLD into modules and implement any module independently from other modules. Modules are mapped, placed, and routed using selected information derived at the time the top-level logic design is partitioned. Finally, the modules are integrated into the top-level logic design using a guided process. Specifically, the information generated during the partitioning of the top-level design and the implementation of each module is used to guide the implementation of the associated logic in the top-level design. In this manner, the implementation of all modules can proceed in any order or in parallel and the integration of the modules into the top-level design can be done quickly and in any order.

72 Claims, 10 Drawing Sheets

MODULAR DESIGN METHOD AND SYSTEM FOR PROGRAMMABLE LOGIC DEVICES

This application claims benefit of 60/207,631, filed May 25, 2000.

BACKGROUND OF THE INVENTION

1. Field of the Invention

The present application relates to logic designs for programmable logic devices (PLDs), and specifically to a modular design method for PLDs.

2. Description of the Related Art

A programmable logic device, such as a field programmable gate array (FPGA), is user-programmed to implement logic designs. In a typical architecture, an FPGA includes an array of configurable logic blocks (CLBS) surrounded by programmable input/output blocks (IOBs). The CLBs and IOBs are interconnected by a hierarchy of programmable routing resources. These CLBs, IOBs, and programmable routing resources are customized by loading a configuration bitstream into the FPGA. This configuration bitstream is generated using software tools.

PLDs having over a million gates are becoming increasingly common. With this increase in the number of gates, there is a corresponding pressure to utilize fully the chip's resources to provide yet more complex logic functionality. Designing the logic for such chips is difficult for one designer to manage. A final logic design (referenced herein as the top-level design) for a million-gate gate PLD may include many logic pieces (referenced herein as modules). Designing these modules sequentially might take one designer a whole year. Even assigning multiple designers to design specific modules will later require combining these modules. This combining process is quite time consuming for the following reasons.

Software is typically structured to have a main program and multiple subroutines for implementing blocks of code referenced in the main program. If the software is complex, multiple people generally write the various subroutines. The main program and subroutines can be written in any order. When complete, the main program calls the subroutines. Of importance, these subroutines are executed as specified regardless of which subroutine was written first.

However, whereas software routines can be stored sequentially in a computer's memory space, modules to be implemented in a PLD require physical space in the PLD and often must have specific shapes. For example, one piece of logic may require a tall vertical column while another piece may require a rectangular array. Another piece of logic may need to make use of specific resources located in only one part of the PLD.

Therefore, if the method used in writing software were used directly in logic design, the modules would conflict with each other and the resources of the device would not be used optimally. Moreover, prior art PLD design flows copy verbatim or directly reference a module in the top-level design. This process undesirably limits a designer's ability to modify the module at a later point in time.

For these reasons, a need arises for a method (1) allowing logic designers to work in parallel on modules of a top-level logic design and (2) facilitating the combination of these modules to implement the logic design on a PLD.

SUMMARY OF THE INVENTION

In accordance with the present invention, logic designers are able to partition a top-level logic design for a PLD into modules and implement any module independently from other modules. Modules are mapped, placed, and routed using selected information derived at the time the top-level logic design is partitioned. (The step of mapping consists of grouping elements of a design into units that can be implemented by a single piece of hardware in the PLD, for example a configurable logic block (CLB) in an FPGA. The step of placing consists of assigning each of these units to a specific piece of hardware, such as a specific CLB. The step of routing consists of designating conductive interconnect lines in the PLD to carry signals from one unit to another as required by the design. There are known algorithms for performing each of these steps.) Finally, the modules are integrated into the top-level logic design using a "guided" design process.

This guided design process is in contrast to merely copying verbatim the information into the top-level design. Using a verbatim copy would introduce inflexibility into the design process. Specifically, merely copying the information into the top-level design would significantly increase the probability that resource contention will occur and/or timing specifications will not be met, thereby resulting in top-level design failure.

In the present invention, information generated during partitioning of the top-level design and implementation of the module is used to guide implementation of the associated logic in the top-level design, thereby ensuring a high probability of top-level design success. Specifically, in one example, information provided by the implemented modules is used in the mapping stage to ensure that any top-level constraints that might need to be pushed into module implementations are correctly processed. This same information is also used in the placing and routing stage, thereby enabling the place and route tools to perform certain optimizations. For example, common signals going to different modules can be identified, thereby allowing the map, place, and route tools to operate faster. Common signal identification and other tool optimizations can significantly increase the performance and quality of the resulting top-level design.

If the space for each module has been budgeted correctly, one module's implementation is independent from any other module's implementation, and the implementation of all modules can proceed in any order or in parallel. Additionally, integration of the modules into the top-level design can be done in any order. Further, later changes or modifications to a design typically affect only a few modules, leaving other modules unaffected, and greatly decreasing the time required for a designer to make the changes. Therefore, compared to prior art processes, the present invention significantly reduces the time to production of the final logic design and provides designers with optimal flexibility in implementing the modules.

Three Basic Phases

In accordance with the present invention, modular design flow includes three basic phases: the initial design phase, the active module phase, and the assembly phase.

Initial Design Phase

The initial design phase, which includes an initial budgeting stage, divides the top-level design into a plurality of unelaborated modules, determines the size and location on-chip (i.e. range) of each module, and defines the input/output (i.e. port) nets for each module. To perform these functions, a ngdbuild tool is run using the electronic design interchange format (EDIF) and netlist constraints (NCF) files to generate top-level native generic object (NGO) and native generic database (NGD) files. A constraints editor tool is run on the top-level NGD file to generate a top-level user constraints file (UCF). The ngdbuild tool is run on the top-level UCF and NGO files to create annotated constraints in the top-level NGD file. Annotation consists of merging constraints from one file into another file. In this case, constraints in the UCF file are copied into respective locations in the NGD file. A floorplanner tool loads (i.e. reads) the top-level NGD and UCF files. The floorplanner tool is then used by the designer to create position and range (size and shape) constraints for each module, and locate top-level logic as well as module ports and any associated constrained pseudo logic (explained in the following paragraph). The resulting constraints are written out to the top-level UCF file.

In accordance with the present invention, each module is assigned a shape and size, preferably by displaying the PLD on a computer monitor and generating a rectangle to represent the shape and size of the PLD region to be occupied by the module. In one embodiment, the position of the module is defined as the location of the center of this rectangle. Then module ports are determined. Module ports provide module input/output signals. Ports may be connected to input/output blocks (IOBs), global logic, or other module ports. A port on one module that connects to a port on another module will be represented by two independent pieces of logic, referenced herein as pseudo logic. In the present invention, pseudo logic is temporary logic that facilitates connection of module ports to one another. Pseudo logic manually placed in a specific location by the user is called "constrained" pseudo logic, whereas pseudo logic generated by the mapper and not modified by the user is called "unconstrained" pseudo logic. In one embodiment, the two pieces of pseudo logic are placed between modules approximately along a line between the two ports.

To ensure correct placement of a module relative to other objects in the top-level design, a plurality of "rubber bands" are connected between a predetermined point in the module (in one embodiment, its center) and its associated IOBs and constrained pseudo logic. In the present invention, the ports for a module are located within the module but generate or receive signals from outside the boundary established for the module. The pseudo logic or IOBs are outside the module and indicate where the port signals go to or come from. Because pseudo logic is not used in the assembly phase, in one embodiment, module-to-module pseudo logic for one module can be located inside the boundary established for another module. In this manner, modules can abut one another, thereby reducing the area needed to implement the final design.

As a last step in the Initial Design Phase, a physically implemented modules (PIM) directory is created in a centralized location. This centralized location, called a Physically Implemented Module (PIM) directory, is created specifically for modular assembly. This PIM directory is a writable directory accessible to all module designers.

Active Module Stages

The active module phase, which independently implements each module, includes the following stages: the module build stage, the module map stage, the module place and route stage, the module floorplan stage (if needed), the module back annotation stage, and the module publishing stage.

In the module build stage, the top-level user constraints (UCF) file is copied into a module directory, thereby creating a module-relative top-level UCF file. A module netlist is created using a standard HDL editor. The module is defined by a module level EDIF file and a module level netlist constraints file (NCF). The ngdbuild tool is run on the module level EDIF and NCF files as well as the module-relative top-level UCF file and the top-level NGO file to generate a module-level NGO file and a module-relative top-level NGD file. The constraints editor tool is run on the module-relative top-level NGD file to add module-specific constraints to the module-relative top-level UCF file. Finally, the ngdbuild tool is run on the module-level NGO file and the top-level UCF file to fully annotate the module-relative top-level UCF constraints into the module-relative top-level NGD file.

In the module map stage, a mapper tool is run on the module-relative, top-level NGD file. If any unconnected ports are identified, then the mapper tool adds unconstrained pseudo logic to those ports. After the addition of unconstrained pseudo logic, module-relative top-level netlist circuit description (NCD) and netlist generic mapping (NGM) files are generated. At the end of this module map stage, all logic elements of the module are assigned to specific physical PLD elements that implement logic functions.

In the module place and route (PAR) stage, a PAR tool, used in a standard manner, determines the placement for the unconstrained pseudo logic and then for the logic elements of the module in the PLD. After placement of the unconstrained pseudo logic and module logic, the PAR tool apportions the appropriate routing resources for all logic (i.e., constrained pseudo logic, unconstrained pseudo logic, and module logic). If the implementation of the module is not correct or fails to meet timing requirements, then the designer first runs the floorplanner tool to directly place the unconstrained pseudo logic and subsequently runs the floorplanner tool to place the module logic. After floorplanning, the design flow returns to the module map stage. Once the implementation of the module is correct, then the design flow proceeds to the module back annotation stage. In the back annotation stage, simulation can be done either with the top-level design as context or independent of the top-level design.

The module level NGO file as well as the module-relative top-level NGM and NCD files (all in the module directory) are published to the PIM directory. In one embodiment, all module-relative top-level files are renamed to module level files in the PIM directory. In the present invention, the active module phase is performed for each module.

Assembly Phase

The assembly phase implements the top-level design while referencing certain module "guide" files. The term "guide" in the present invention refers to instructions that provide sufficient information for a process to quickly recreate the exact mapping, placement and routing of a module into a target design. In the final implementation stage, the ngdbuild tool is run on the top-level UCF file with a path to the PIM directory. Specifically, the module level NGO files for the modules are accessed from the PIM directory to create a new top-level NGD file. The constraints editor tool can optionally be run at this point to apply timing constraints to the top-level NGD file or modify existing timing constraints. The mapper tool is run on this fully instantiated NGD file using the module level NCD files in the PIM directory as guides, thereby generating fully elaborated top-level NCD and NGM files. The PAR tool is run on the top-level NCD file, again using the module level NCD files in the PIM directory as guides. If the top-level design is incorrect or fails to meet timing constraints, then the designer can manually designate the appropriate tool for correction. Mapping, placing, and routing are performed again, as necessary. If the top-level design is correct, then back annotation can be run to simulate the fully implemented top-level design.

DETAILED DESCRIPTION OF THE FIGURES

Definitions

Figures 1A, 1B:
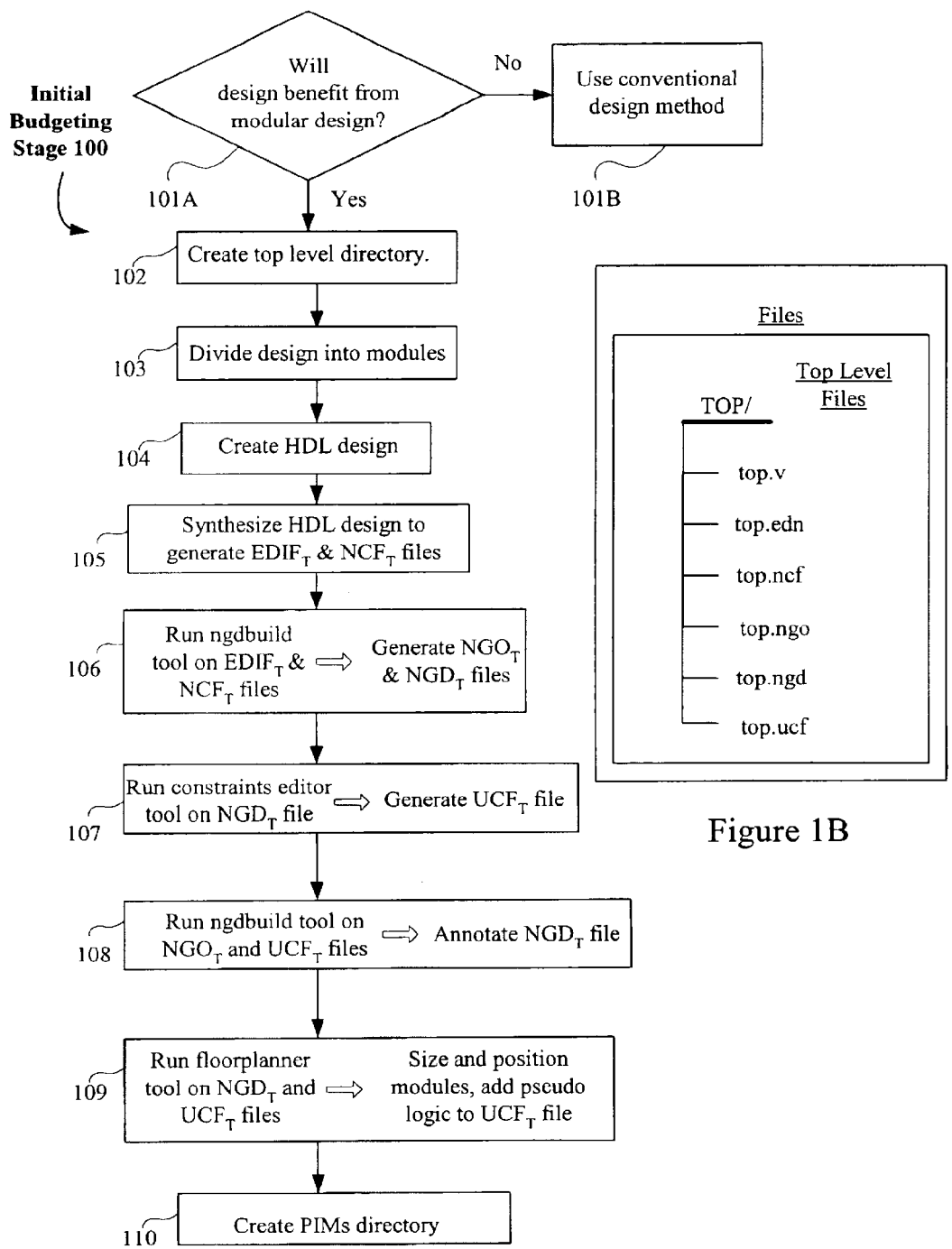
FIG. 1A illustrates an initial budgeting stage in which the top-level logic design is created.
FIG. 1B illustrates files corresponding to the initial budgeting stage, including files in a top-level directory.

To aid the reader in understanding the present invention, the acronyms and terms of art used in this description are defined alphabetically following this paragraph.

CLB: configurable logic block; a basic building block on a programmable logic device for providing logic functions; an illustrative CLB is described in the "1999 Programmable Logic Data Book", published by Xilinx, Inc, pages 3–7 to 3–10.

Constraints: specifications regarding routing, timing, area, mapping, and placement for the implementation process.

Constraints Editor: GUI tool to enter design constraints.

DLL: delay locked loop; used in an integrated circuit to eliminate skew between a clock input pad and the internal clock inputs on the integrated circuit.

EDIF: Electronic Design Interchange Format that includes the hierarchy of the input schematic.

EDN: EDIF file name.

ENVAR: environment variable; allows a tool to be used in a different manner in different windows.

Floorplanner: tool for floorplanning; generally used when starting with a design without substantial physical information; tool does not handle routing.

Floorplanning: manually placing one or more logic elements and/or blocks of logic into a PLD to increase density, routability, or performance.

HDL: Hardware Description Language.

Instantiation: making a copy of a module in a specific position in a design.

LOC: locate; used to position a piece of logic at a specified location.

IOB: input/output block, a basic building block on a programmable logic device for providing an interface between circuits on the device and external devices/systems; an illustrative IOB is described in the "1999 Programmable Logic Data Book", published by Xilinx, Inc, pages 3–5 to 3–7.

Mapper: a tool that groups portions of a logical design into units to be implemented by PLD elements such as CLBs and IOBs.

Mapping: process that assigns the logic elements of a design to specific physical PLD elements such as CLBs that implement logic functions in the PLD.

NCD: netlist circuit description; an output file of the mapper; a flat physical design database correlated to the physical side of the NGD file.

NCF: netlist constraints file produced by a vendor tool set containing timing and layout constraints for each module.

Netlist: text description of a design circuit and its connectivity.

NGA: native generic annotated; NGD file annotated with timing and placement information.

NGD: native generic database; contains a complete logical description of the design reduced to elements (e.g. AND gates, OR gates, decoders, flip-flops, and RAM), all constraints associated with these elements, and a description of the original hierarchy expressed in an input netlist.

Ngdbuild: tool that reads netlist files in EDIF format and/or NGO files, links them together, and outputs an NGD file.

NGM: native generic map; NGD file annotated with mapping information

NGO: native generic object; binary database describing a portion of a logic design in terms of the components and hierarchy specified in the input design file, does not contain constraints from the user constraints file, may contain constraints from other files (i.e., EDIF and NCF).

PAR: a place and route tool that determines the placement for design elements into specific positions in the PLD and apportions the appropriate routing resources after placement of the elements.

PIM: physically implemented module.

PLD: programmable logic device; generic term for any programmable logic device, such as a field programmable gate array (FPGA), a complex programmable logic device (CPLD), an application specific integrated circuit (ASIC), or an electrically programmable logic device (EPLD).

TPSYNC: time point synchronize; a constraint associated with the timing internal to and connecting into a module.

UCF: user constraints file; includes user-specified logical constraints.

VHDL: VHSIC (very high speed integrated circuit) hardware description language; a design entry standard defined in IEEE 1076.1.

General Description of Software Tools

Logic capture tools for PLDs are either language-based (e.g., described in Hardware Description Language, or HDL) or schematic-based (built from illustrations of circuit elements or gates). These capture tools typically process the data and save it as a netlist, i.e. a description of the logic design comprising a list of low-level circuit elements or gates and the connections (nets) between the outputs and inputs thereof.

A mapper tool translates the logic design represented by the netlist into the physical resources provided on the PLD, such as look-up tables, flip-flops, clock buffers, I/O pads, tristate buffers, etc. The mapper tool provides groupings of these resources expressed in terms of the number of CLBs and IOBs.

Then, a place and route tool (the PAR tool) determines a placement for the associated blocks of these groupings in the PLD and after placement of the blocks apportions the appropriate routing resources.

A floorplanner tool is a graphical tool that gives the designer control over locating elements of a logic design in a target PLD using a "drag and drop" paradigm with the mouse pointer. In one embodiment, the floorplanner tool displays a hierarchical representation of the logic design in a computer window using hierarchy structure lines and colors to distinguish the different hierarchical levels. The window displays the floorplan of the target PLD and allows the designer to draw rectangles into which the designer puts logic from the hierarchy.

Applications for Modular Design

The present invention provides significant advantages to designers of large designs as well as to companies seeking reduced time to market. A few illustrative applications for modular design are provided below to demonstrate these advantages.

Team Design

In a first scenario, a team of designers is required to quickly implement and verify a large design within a PLD. Large designs are generally difficult to manage if kept as a single, monolithic entity. By dividing a design into smaller pieces, i.e. modules, each piece can be separately understood and implemented. To begin the process, a team leader provides a rough layout of the design using a standard HDL tool. At this time, the team leader designates each module in the design. The team leader should lay out the interface from the top-level design to each module and between modules as much as possible. All top-level global resources and signals should be added.

Then, the team leader uses the floorplanner tool to manually position each module, the interface circuitry, and the global resources/signals within the target PLD. Logically, the more that can be placed at this time, the less reconciliation will be needed later. The floorplanner tool then outputs certain "UCF" files that will be used in each module's implementation.

As a next step, the team leader assigns each module to an implementation team. Each team begins their work using their assigned UCF files. As described in detail below, each module can be fully implemented independent of the other modules. As each module is implemented, the implementation team publishes its results back to the team leader.

The final implementation typically starts after all of the modules have been published to the team leader. The final implementation may require additional constraints not initially envisioned by the team leader, thereby affecting certain module implementations within the design. Thus, if certain modules are found to fail timing or other criteria, the implementation teams responsible for those modules will be required to re-implement and republish their changes to the team leader. After any changes have been made and the design finally meets all required criteria, the design can be implemented like any other design.

Engineering Change Orders

In a second scenario, a portion of a logic design that was originally implemented using modular design is required to be changed. In fact, a logic design frequently includes large portions of logic that rarely change and a few pieces of logic that are subject to change as the design progresses or even after the design is implemented.

In the present invention, to change the design, the implementation team modifies and re-verifies the original implementation of one module, as needed, using existing tools. Thus, by dividing a logic design into modules, the relatively static modules can be implemented once and thereafter are not subject to the timing or layout changes associated with more dynamic modules of the design. Because the modules designed according to the invention are independent of each other, changing one module is orders of magnitude simpler and faster than performing changes to a prior art, fully flattened design. Further, since the change is usually isolated to a single module, the effect of the change is less far reaching.

Once the change is complete, the implementation team can republish the module back to the team leader. The team leader then reruns the mapper and PAR tools to provide a full design implementation. The "guide" operation assists these tools, thereby significantly reducing the time to final implementation because of the amount of unchanged information. In the rare instance that the change within the errant module causes other module implementations to either fail or not meet timing, those affected modules are also modified and republished.

Instantiate a Module Multiple Times in a Design

In a third scenario, a given module needs to be instantiated multiple times in the same design. As a first step, the implementation team implements the module using the above-described modular design flow. Once that module has been published, the team leader can make a copy of that module and then rename the copy. The renamed copy is implemented as a separate instantiation. This copying and renaming process is repeated as needed. Of importance, irrespective of the number of instantiations of a module, each instantiation of a module is implemented in a self-contained manner relative to its eventual location as specified in its associated UCF file.

Use Module from One Design in Another Design

In a final scenario, an implemented module for one design is required to be placed in another design. This process is performed in the same way in which multiple instantiations are generated, as described in detail above.

Note that the above-described applications are illustrative only and not limiting. Those skilled in the art will recognize other applications of the present invention.

In accordance with the present invention, modular design flow includes three basic phases: the initial design phase, the active module phase, and the assembly phase.

Initial Design Phase

The initial design phase, which includes an initial budgeting stage, divides the top-level design into a plurality of unelaborated modules, determines the size and location on chip (i.e. range) of each module, and defines the input/output (i.e. port) nets for each module. Because module implementation is highly dependent on the resources available on chip and in light of the significant differences in resources available on different chips, a PLD having a specific architecture, package, and speed is preferably selected before the initial budgeting stage.

Initial Budgeting Stage 100

FIG. 1A illustrates an initial budgeting stage 100 in the modular design flow of the present invention. Step 111A first determines whether a logic design should be partitioned into modules. This determination may include considerations such as module characteristics and global resources. Specifically, an optimal module has a minimal number of ports (i.e., connections into or out of the module). A module with a minimal number of ports is more self-contained than one with many ports. The ability of a module to be self-contained, and thus less dependent on the function of other modules, generally allows that module to be more optimally implemented. A module should also have minimal need for global logic. Global logic, defined as logic that serves the entire chip or is not evenly distributed across the chip, increases the potential for resource allocation contention between modules. Specifically, modules may have to share global logic, therefore modules that require less global logic are less likely to compete for global logic with other modules, minimizing the possibility of resource contention in the design.

If the design would not benefit from modular design flow, then conventional design methods should be used, as indicated in step 101B. If the design would benefit from modular design flow, then the process proceeds to step 102, and a top-level directory TOP/ is created. FIG. 1B illustrates files corresponding to initial budgeting stage 100, including files in the top-level directory TOP/. The top-level directory TOP/ is preferably accessible by each of the module implementers, as described in detail below.

In step 103, the design is roughly divided into modules. In one embodiment, each module includes a high level description of what each module should do, what region of the target architecture it should occupy (i.e. a relative physical location with respect to other logic on the chip), and necessary connections to other modules. Finally, any known top-level global resources (such as input/output blocks (IOBs), pins, random access memory (RAM), and delay lock loops (DLLs)) as well as known global signals (such as clock signals) can be added to the design. Note that global resources and signals are not required to be placed in the top-level design, but are used in a preferred embodiment to provide the maximum amount of context during the active module phase (described in detail below).

After dividing the top-level design into modules, in step 104 an HDL editor creates the HDL representation of the top-level design. Note that although the HDL editor can lay out the global resources and signals in a standard manner, the modules comprising the design are still unelaborated. Therefore, each module is represented as a black box. In step 105, the HDL file is synthesized, thereby generating EDIF (top.edn) and NCF (top.ncf) files. (In this embodiment, the design is generated in verilog. Therefore, the top-level HDL file is designated top.v)

In step 106, a command ngdbuimodular initial top.edn triggers an ngdbuild tool to run on the top-level EDIF (top.edn) and NCF (top.ncf) files. Note that when present, the top.ncf file is processed implicitly by the ngdbuild tool. The above ngdbuild command "modular" is used to indicate to the ngdbuild tool that a modular design flow is being used, and the "initial" argument is given to indicate the process is in initial budgeting stage 100.

Step 106 generates NGO (top.ngo) and NGD (top.ngd) files for the top-level design with all of the instantiated modules still represented as unelaborated blocks. In general, both files reference all modules. However, the NGD file will be more complete. The top.ngo file includes the top-level design with any constraints from the top.edn and top.ncf files, but without any constraints from a user constraints file (UCF)(such as PERIOD constraints described in detail in reference to step 107), whereas the top.ngd file includes the top-level design with any constraints from the top.edn and top.ncf files as well as the user constraints file. (Note that because this UCF file is not yet generated, the top.ngo and top.ngd files actually contain the same information (approximately) at this point in time.) In accordance with the present invention, the top-level NGD (top.ngd) file is not mapped at this time (as done in the prior art), but will be used as context information in a subsequent step.

At this time, PERIOD (time between rising edges of a clock signal) constraints for all clocks and input/output (IO) timing (time between two pins, typically measured from a clock input at a first pin and data out at a second pin) constraints for IOs should be placed in the top-level design. In step 107, to add these constraints, a command constraints_editor top.ngd triggers a constraints editor tool to run on the top-level NGD (top.ngd) file to generate a top-level UCF (top.ucf) file. (Note that because each module is represented as an unelaborated block, timing constraints relative to the contents of any module cannot be entered in initial budgeting stage 100.)

In step 108, a command ngdbuild-modular initial top.ngo top.ucf triggers the ngdbuild tool to run on the top-level NGO (top.ngo) and the top-level UCF (top.ucf) file to write the constraints of the top-level UCF (top.ucf) file into the top-level NGD (top.ngd) file.

Note that if there are no clock loads in the top-level design, then a clock net will not appear in the constraints editor tool and some other method, such as using NCF constraints, should be used for defining PERIOD and IO timing constraints. Therefore, in one embodiment, a dummy register driven by a net is added to the top-level design, thereby providing information to the constraints editor tool to treat this net as a clock net. If the register has no load, then it is removed during the mapping step in the final implementation stage.

Figure 1C:
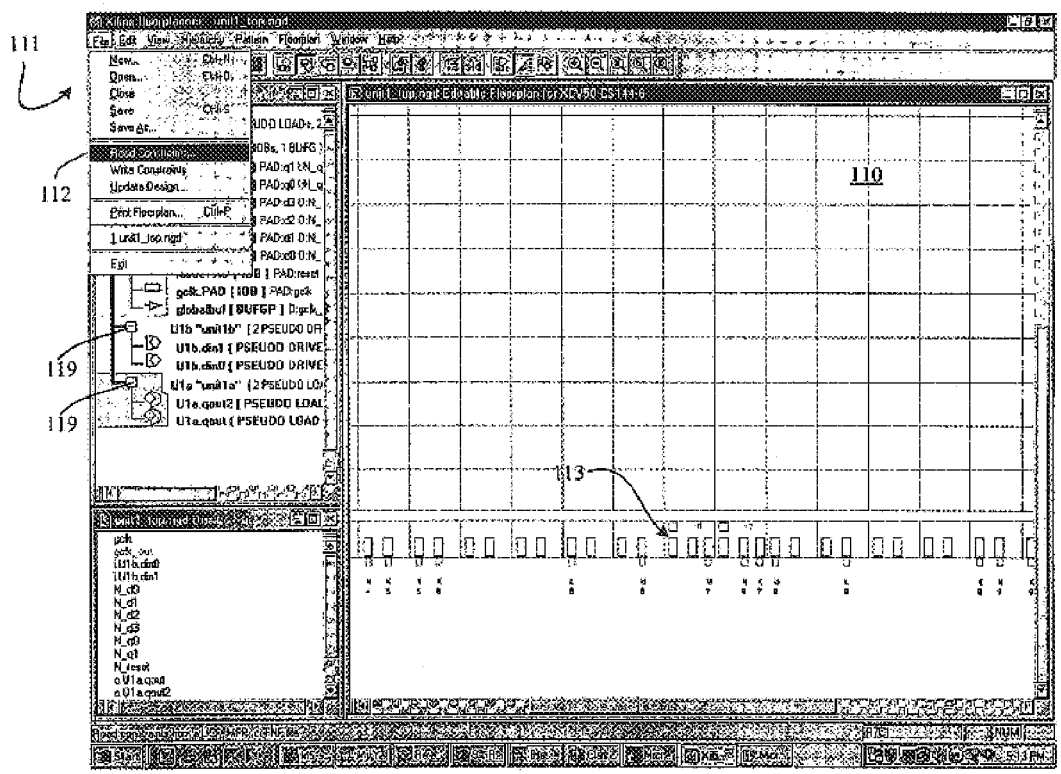
FIG. 1C illustrates an open floorplanner window in which one grid represents one CLB of the FPGA.

After the top.ngd file is annotated, in step 109 the floorplanner tool is run on the top-level NGD (top.ngd) and UCF (top.ucf) files. FIG. 1C illustrates an open floorplanner window 110 having a File pull down menu 111. Activating the Read Constraints command bar 112, as highlighted, triggers the floorplanner tool to load the top.ucf file, thereby ensuring that the output UCF file from step 109 will contain merged constraints. Window 110 includes a grid pattern representing a portion of an FPGA, wherein each block of the grid represents a configurable logic block (CLB) on the FPGA. At the bottom of window 110, a number of IOBs 113 are indicated as small rectangles.

The floorplanner tool recognizes unelaborated blocks as modules and indicates them as groups within Design Hierarchy window 110. In FIG. 1C unelaborated blocks U1b"unit1b " [2PSEUDO DRIVE] and U1a "unit1a" [2PSEUDO LOAD] can be seen at location 119 in the left portion of window 110. While the floorplanner tool is running, the designer defines the size and area on the target chip for a module by selecting the module in Design Hierarchy window 110 and then activating an "Assign Area Constraint" bar (not shown) on the "Floorplan" pull down menu. In a typical embodiment, defining the position and range (i.e., location, size and shape) of the module is done by defining an initial point with the mouse cursor and dragging the mouse to define a specific rectangular area on the target FPGA. See FIG. 1D for an example in which modules A and B have been defined. In one embodiment, the size of the module (i.e., number of CLBs) and shape of those contiguous CLBs is estimated by the designer. In another embodiment, the floorplanner tool estimates size and shape of a module. In other embodiments, the floorplanner tool or another tool may provide recommended sizes and shapes of CLBs for various types of modules based on empirical information. This floorplanning process is repeated for all modules.

The next operation is to position all of the ports for each module on the target FPGA. In accordance with the present invention, port nets are defined to carry the input/output signals for a module. Each port net of a module is depicted as connected to some piece of logic referred to as the "ports" of the module. Port nets may connect to input/output blocks (IOBs), logic defined in the top level design, and/or module-to-module connection points (called pseudo logic).

Figure 1D:
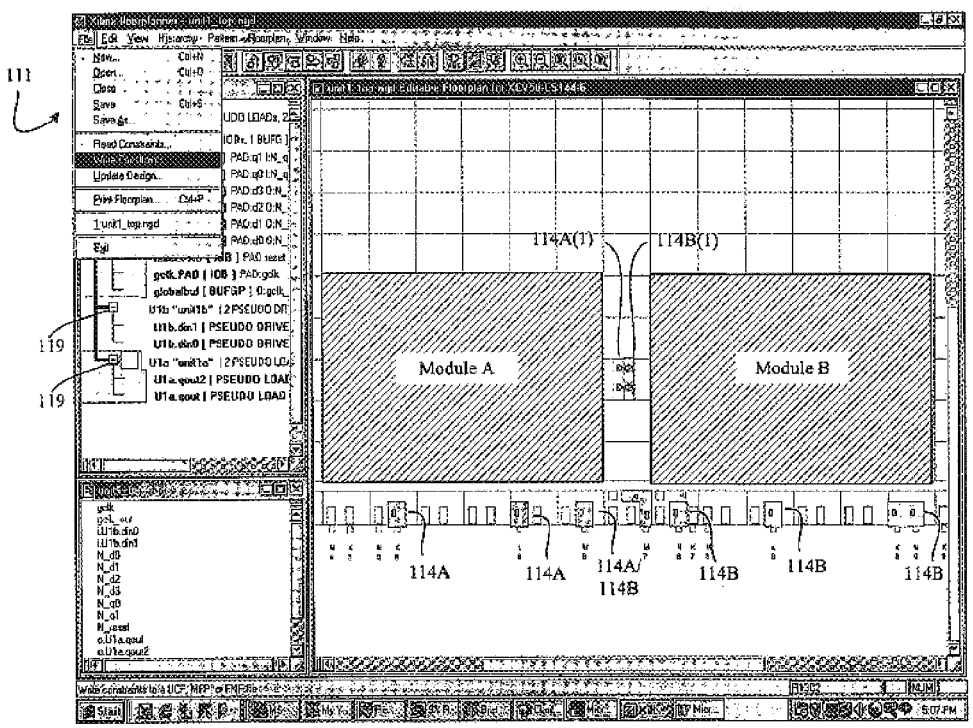
FIG. 1D illustrates an open floorplanner window showing various port locations for two modules.

FIG. 1D shows pseudo logic locations 114A and 114B for modules A and B, respectively. In one embodiment, a given port net that connects two modules has two pieces of pseudo logic. For example, a port net connecting modules A and B is represented by pseudo logic 114A(1) and 114B(1). Note that each piece of pseudo logic of each module should be placed so that correct alignment of buses can occur. In accordance with the present invention, pseudo logic 114A(1) for module A is positioned outside the boundary of module A and pseudo logic 114B(1) for module B is positioned outside the boundary of module B.

Figure 1E:
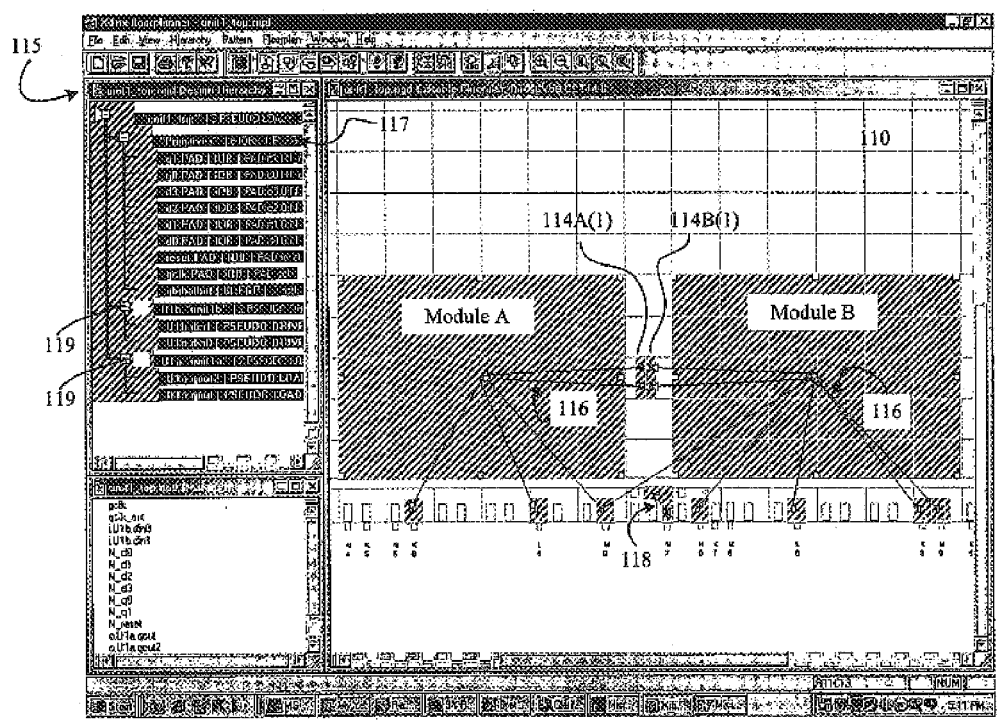
FIG. 1E illustrates an open floorplanner window in which rubber bands graphically indicate a module's connections to its respective ports.

As shown in FIG. 1E, selecting the expansion button 119 on a module in the Design Hierarchy window 115 (in this illustrative window, one of modules U1*b* "unit1*b*" or U1*a* "unit1*a*" (modules B and A, respectively, in window 110)) will expose all of the module-to-module connection points for that module (for example, two pseudo drivers U1*b*.din1 and U1*b*.din0 for module U1*b* "unit1*b*" and two pseudo loads U1*a* qout2 and U1*a*.qout for module U1*a* "unit1*a*"). Each of these ports can then be placed by selecting it and dragging it with the mouse to the desired location. All other ports (IOBs or top level logic) are listed under the "Primitives" group heading 117 in Design Hierarchy window 115. Note that IOB 118 in window 110 (gc1k.PAD[IOB] in Design Hierarchy window 115) has an adjacent, global buffer (globalbuf{BUFGP] in Design Hierarchy window 115). All port locations are floorplanned in step 109.

Module to module connection points are also referenced herein as "pseudo" logic. In the present invention, pseudo logic is defined as temporary logic that facilitates the correct placement of the module ports relative to one another. Pseudo logic manually placed by a user in a specific location, such as floorplanned port 114A(1) or port 114B(1) shown in FIG. 1D, is called "constrained" pseudo logic, whereas pseudo logic generated in association with a port without manual placement by a user (explained later in reference to step 303 in the module map stage 330) is called "unconstrained" pseudo logic. In FIG. 1E, each port 114A (1) and 114B(1) includes an associated pseudo driver (flip-flop) and pseudo load (buffer) as shown in the design hierarchy window 115. Other examples of pseudo logic may include tristate buffers (TBUFs). In the present invention, the selection of constrained pseudo logic and its placement is determined by the user (in contrast to the selection of unconstrained pseudo logic described in detail in the section entitled, PSEUDO LOGIC). In a preferred embodiment, the output ports of a module are registered, thereby isolating the timing of one module from that of another module. Because timing paths end at registers, this embodiment lets critical paths be noted and improved within modules.

Pseudo logic is eliminated in the final design. Thus, in the embodiment shown in FIG. 1D, after the module-to-module ports 114A(1) and 114B(1) are eliminated, a column of CLBs between modules A and B would remain unused. Therefore, in another embodiment, ports 114A(1) and 114B (1), rather than being floorplanned between the modules, are positioned instead within adjacent modules B and A, respectively. In this manner, modules A and B can abut one another and no CLBs need be left unused between modules in the top-level design.

Referring to FIG. 1E, the floorplanned objects are then selected to turn on "rubber bands" 116. These rubber bands graphically indicate a module's connections to its respective ports 114. In accordance with the present invention, rubber bands 116 also indicate physical relationships to other objects in the top-level design. In other embodiments, rubber bands 116 take into consideration the routing resources of the chip between modules and therefore, in addition to indicating physical relationships, can optimize placement of the modules relative to one another by pulling the modules into optimal locations based on an analysis of resource allocation.

The floorplanner tool can also be used to connect any global logic (not shown in FIGS. 1C–1E) to the module ports. For example, in a preferred embodiment, the tristate buffers (TBUFs) are constrained to fixed locations in the top-level floorplan. Specifically, for some PLD architectures, any ports that correspond to TBUF connections must be floorplanned so that all TBUF ports driving the same signal are on the same long line of the FPGA. Note that these TBUF ports can belong to different modules. The rules regarding ports and global logic, including tristate buffers, are defined in detail below.

The floorplanner tool generates a top-level UCF (top.ucf) file that includes all of the constraints for each module (i.e., position, range, port locations, and any constrained pseudo logic). FIG. 1D highlights the Write Constraints command bar in File pull down menu 111 which, when activated, writes all floorplanned constraints to the top.ucf file. This top-level UCF (top.ucf) file will be used in the module build stage 200 to correctly position each module. For this reason, the ngdbuild tool does not need to be run to reannotate these constraints back into the top-level NGD (top.ngd) file. Instead, the top.ngo and top.ucf files will be used directly in subsequent stages.

Active Module Phase

The active module phase, which independently implements each module, includes the following stages: the module build stage, the module map stage, the module place and route stage, the module floorplan stage (optional), the module simulation stage, and the module publishing stage.

Figure 2A:
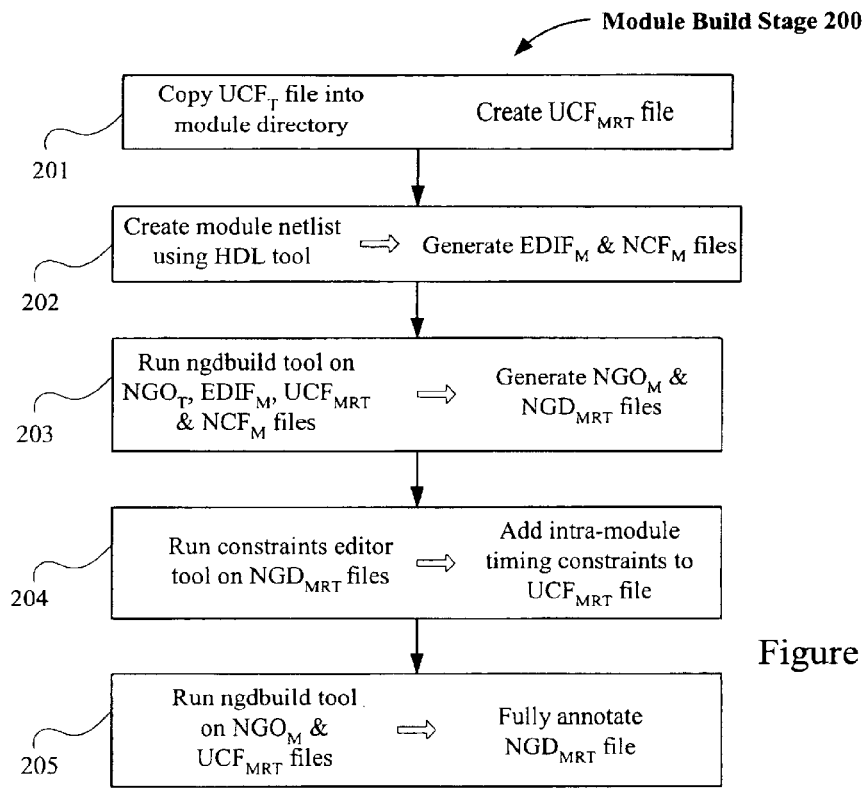
FIG. 2A illustrates a module build stage in which a module of the logic design is created independently from other modules.

FIG. 2A: Module Build Stage 200

Figure 2B:
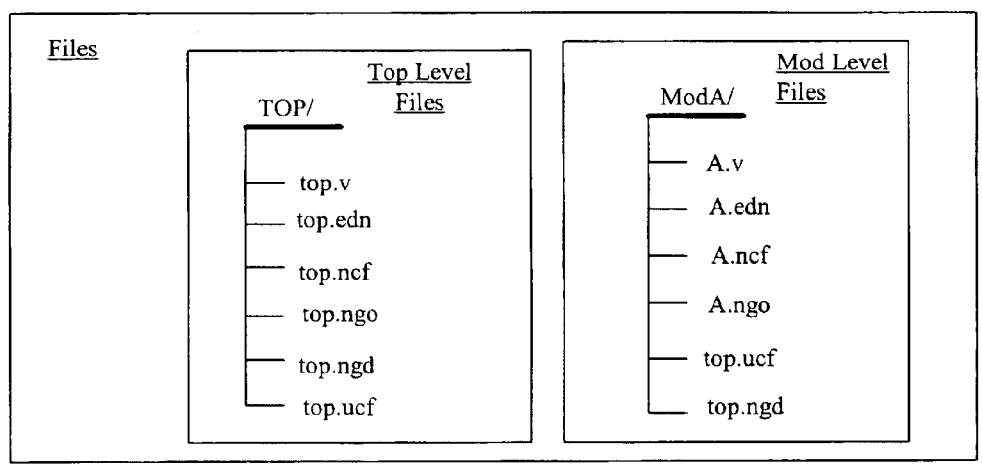
FIG. 2B illustrates files corresponding to the module build stage, including files in a module A directory and the top-level directory.

After a minimal set of the top-level design information is created in initial budget stage 100, the individual modules can be implemented in a module build stage 200, illustrated in FIG. 2A. FIG. 2B illustrates files corresponding to the module build stage, including files in a module A directory and the top-level directory. Note that module implementation is done in a directory different from that in which the top-level design information was created. For purposes of this description, assume a directory ModA/is created for the implementation of module A.

According to the invention, conventional implementation tools, such as the mapper and PAR tools, are modified to recognize modules generated in module build stage 200 from information saved by the ngdbuild tool in the top.ngd file and to keep all logic and routing within the defined module boundaries. To guarantee that the implementation of each module will be compatible with other modules' implementations, and to facilitate future modifications to a module without affecting other modules, no logic optimization occurs across the boundary of the module.

In step 201, the top-level UCF (top.ucf) file is copied into the ModA/ directory, thereby creating a module-relative top-level UCF file. The HDL netlist for module A (i.e. file A.v in FIG. 2B) can be created in step 202 with any known HDL editor in a standard manner. The module HDL netlist is then synthesized, thereby generating corresponding module level EDIF (A.edn) and NCF (A.ncf) files.

In step 203, the ngdbuild tool is run on the top-level NGO (top.ngo) file (still located in the TOP/directory), the module level EDIF (A.edn) and NCF (A.ncf) files, and the module-relative top-level UCF file. In the present invention, the top.ngo file is used to give some implementation context to module A, since it is implemented independent of any other modules. Thus, the top-level design acts as a test bench to provide additional context during module implementation. This concept affects the names of some files in the module directory. Specifically, some files in the module directory include not only module implementation information but also top-level design implementation information. Therefore, those files that include top-level design information are named after the top-level design (i.e., top.__) rather than after a module (A.__, for example). These files are referenced herein as module-relative top-level files.

The command ngdbuild-modular module-active A.edn-uc top.ucf TOP/top.ngo triggers step 203. Note that, if present, the A. files are used by the ngdbuild tool and therefore need not be provided as an argument in the command. The copied UCF file top.ucf in the current directory is explicitly specified as an argument to the command. Step 203 generates a module level NGO (A.ngo) file for module A and a module-relative top-level NGD (top.ngd) file stored in the ModA/ directory. The A.ngo file only contains the module implementation logic (no range or timing constraints). In contrast, the top.ngd file in the ModA/ directory contains the top-level logic, module A implementation logic (the active module), references to any unelaborated modules (such as module B), and the range and timing constraints for all modules added during initial budgeting stage 100.

In step 204, a command

Constraints_editor top.ngd triggers the Constraints Editor to run on the module-relative top-level NGD (top.ngd) file to generate timing constraints which pertain to module A's implementation and to add these constraints into the module-relative top-level UCF (top.ucf) file in the ModA/ directory. For example, the periods for any local clocks or module port timing constraints can be added. Modular port timing constraints allow for constrained timing from either a synchronous element within a module to its port or from a port to the synchronous elements within the module. The timing for ports allows the user to specify the path delay requirement of the data to propagate from the port to the setup at the register for inputs or from the clock pin of the register to the port for outputs.

The ngdbuild program is then rerun in step 205 on the A.ngo and top.ucf files to annotate these new constraints into the module-relative top-level NGD (top.ngd) file in the ModA/ directory. FIG. 2B illustrates files corresponding to module build stage 200, including files in a module A directory and the top-level directory. At this point, the module build stage 200 ends and the design flow proceeds to the module map stage 300 shown in FIG. 3A.

Figure 3A:
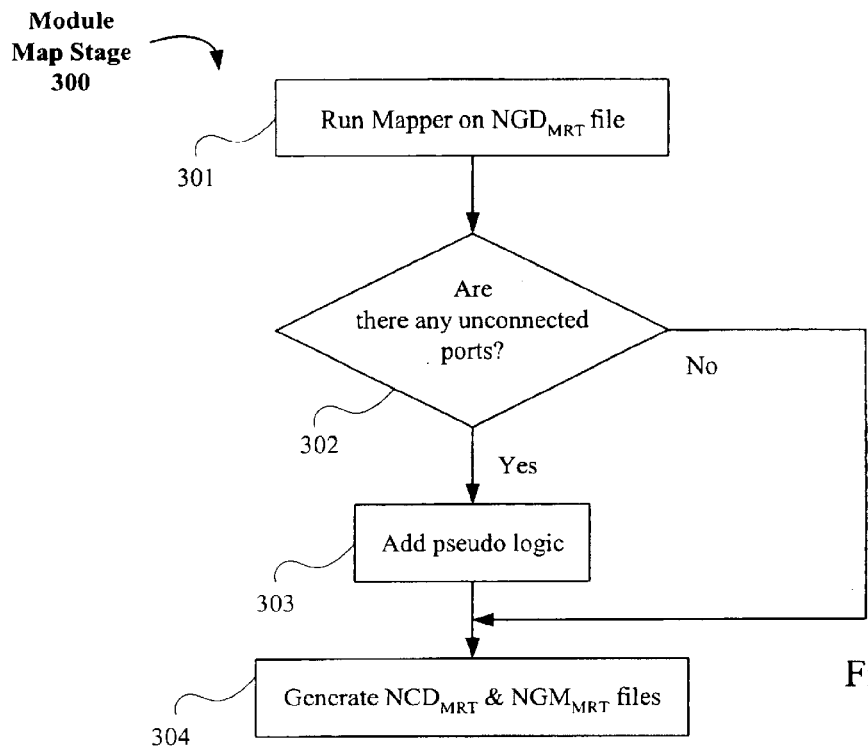
FIG. 3A illustrates a module map stage in which a module is mapped onto the physical resources of the PLD.

FIG. 3A: Module Map Stage 300

In step 301, a command map top.ngd<additional_map_switches> triggers the mapper to run on the module-relative top-level NGD (top.ngd) file in the ModA/ directory. In this step, the mapper identifies the module-relative top-level NGD (top.ngd) file as a module implementation and scans the file to identify the logical node with the same name as the active module (in this case, module A). (Recall that the top.ngd file in the ModA/ directory includes references to any unelaborated modules as well as to the elaborated (i.e. active) module.) When the mapper locates the active module (starting at the logical node named "module_A"), it will scan for any unconnected ports in step 302 for module A. In the present design flow, all ports of the active module should have associated drivers or loads within the module.

If any unconnected ports are identified, then in step 303, the mapper connects the appropriate pseudo logic to those ports. Recall that constrained pseudo logic is manually placed by the user. In one embodiment, unconstrained pseudo logic can later be manually floorplanned to constrain the full implementation of the module. Pseudo logic can include pseudo drivers (flip-flops), pseudo loads (buffers), and/or pseudo tristate buffers. Placement of pseudo logic is described in further detail in the section entitled, "Modular Design Software Changes".

Figure 3B:
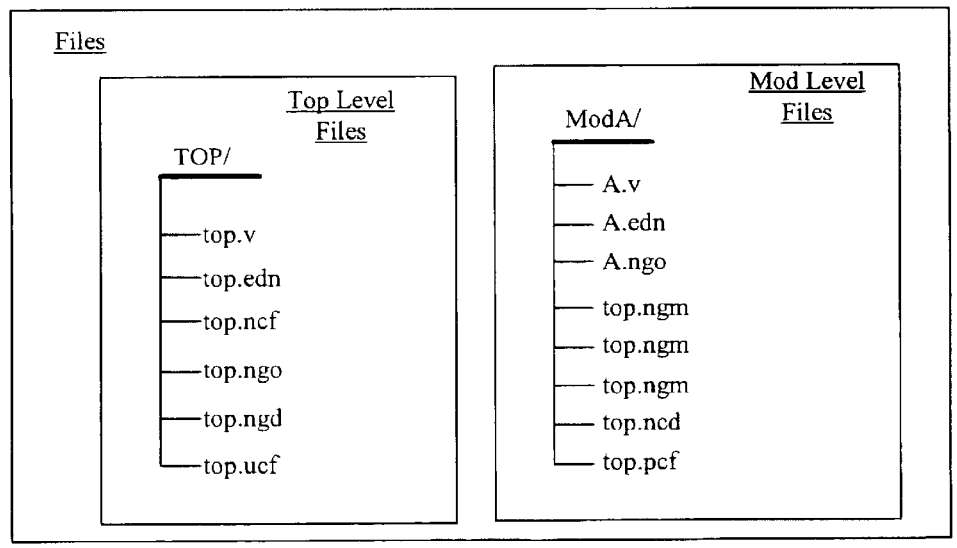
FIG. 3B illustrates files corresponding to the module map stage, including files in the module A directory and the top-level directory.

After pseudo logic is added in step 303 or if no unconnected ports are identified in step 302, in step 304, the mapper generates a module-relative top-level NCD (top.ncd) file, a module-relative top-level NGM (top.ngm) file (also including pseudo logic), and a module-relative top-level PCF (top.pcf) file. FIG. 3B illustrates files corresponding to module map stage 300, including files in the module A directory and the top-level directory. Note that each piece of pseudo logic created is appropriately marked in the top.ncd file and each signal corresponding to a port in A.edn file is flagged for future processing (explained in detail in reference to the module simulation and publishing stage 600 shown in FIG. 6).

Modification of the top.pcf file, which allows fine-tuning of the design at a very low level, is optional in the present invention. Typically, only power users will have the requisite expertise to derive any benefits from using this file. In fact, standard designers can easily misuse the top.pcf file, thereby destroying the functionality of the top-level design and breaking the connection to the logical design. In contrast, the top.ucf file is easily understood and used, and thus is preferred in the design flow of the present invention over the top.pcf file.

The top.ngm file, like the top.ncd file, is a mapped NGD file that includes a list of created components and the pieces of such components. However, the top.ncd file includes routing information whereas the top.ngm file does not. Thus, as described below, the top.ncd file is used for placing and routing and the top.ngm file is used only for simulation (back annotation).

Figure 4:
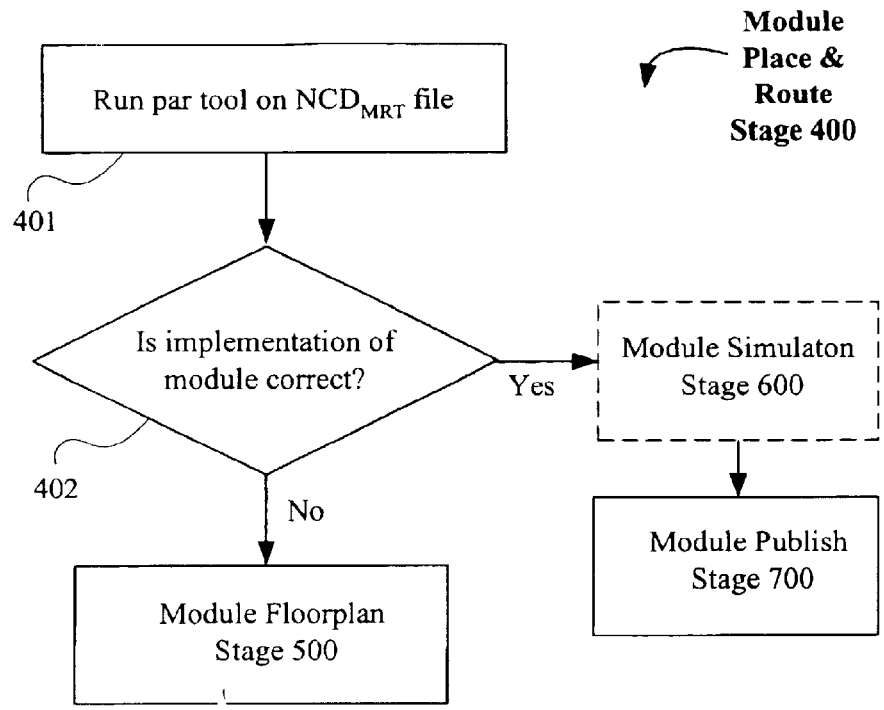
FIG. 4 illustrates a module place and route stage.

After step 304, the module map stage 300 ends and the design flow proceeds to a module place and route stage 400 shown in FIG. 4.

FIG. 4: Module Place and Route Stage 400

In step 401, a command par top.ncd output ncd_filename <additional_par_switches> triggers the PAR tool to run on the module-relative top-level (top.ncd) file. In response, the PAR tool first places any unconstrained pseudo logic, then places the module logic. Note that unconstrained pseudo logic is placed outside of the range defined for the module boundary. The PAR tool then routes the logic (i.e., constrained pseudo logic, unconstrained pseudo logic, and module logic). In one embodiment, an output_ncd_filename flag causes the PAR tool to create an output file different from its input file instead of overwriting its input file, thereby preserving the input file for possible future use.

If the module is correctly implemented (i.e., meets timing and area budgets) as determined in step 402, then the design flow proceeds to an optional module simulation stage 600 or directly to a module publish stage 700. If the module is not correctly implemented, then the design flow proceeds to the module floorplan stage 500 illustrated in FIG. 5. (Note that if the area provided for the module is significantly undersized or over-sized for the physical logic within its boundary, then the design flow may need to loop back to step 108. However, assuming initial budgeting stage 100 is carefully performed by a competent designer, this drastic step is rarely necessary).

Figure 5:
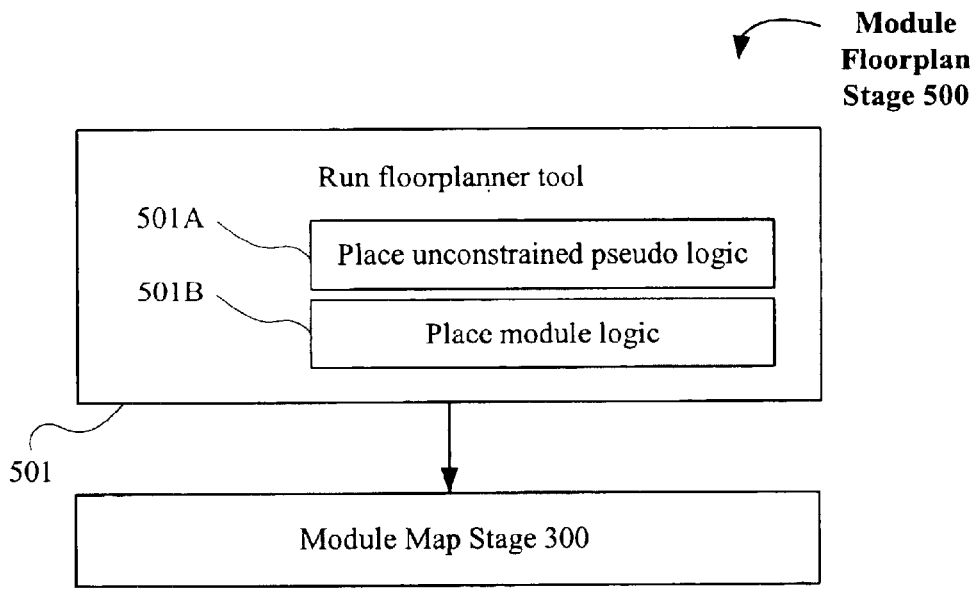
FIG. 5 illustrates a module floorplan stage.

FIG. 5: Module Floorplan Stage 500

As determined by step 402, if the implementation of the module is not correct or does not meet the required timing, then it will be necessary for the user to more fully constrain the module implementation. In step 501, the user runs the floorplanner tool. In a preferred embodiment, the floorplanner tool is used to first place all of the unconstrained pseudo logic (added by the mapper in step 303) in substep 501A, then to place the module logic in substep 501B. Note that although constrained pseudo logic can also be floorplanned in stage 500, such floorplanning can result in the loss of information if the user returns to initial budgeting stage 100. Therefore, in the preferred embodiment, only unconstrained pseudo logic is floorplanned. After floorplanning is completed, the design flow returns to module map stage 300 to ensure the module-relative top-level NCD (top.ncd) file is correctly generated.

Figures 6, 7:
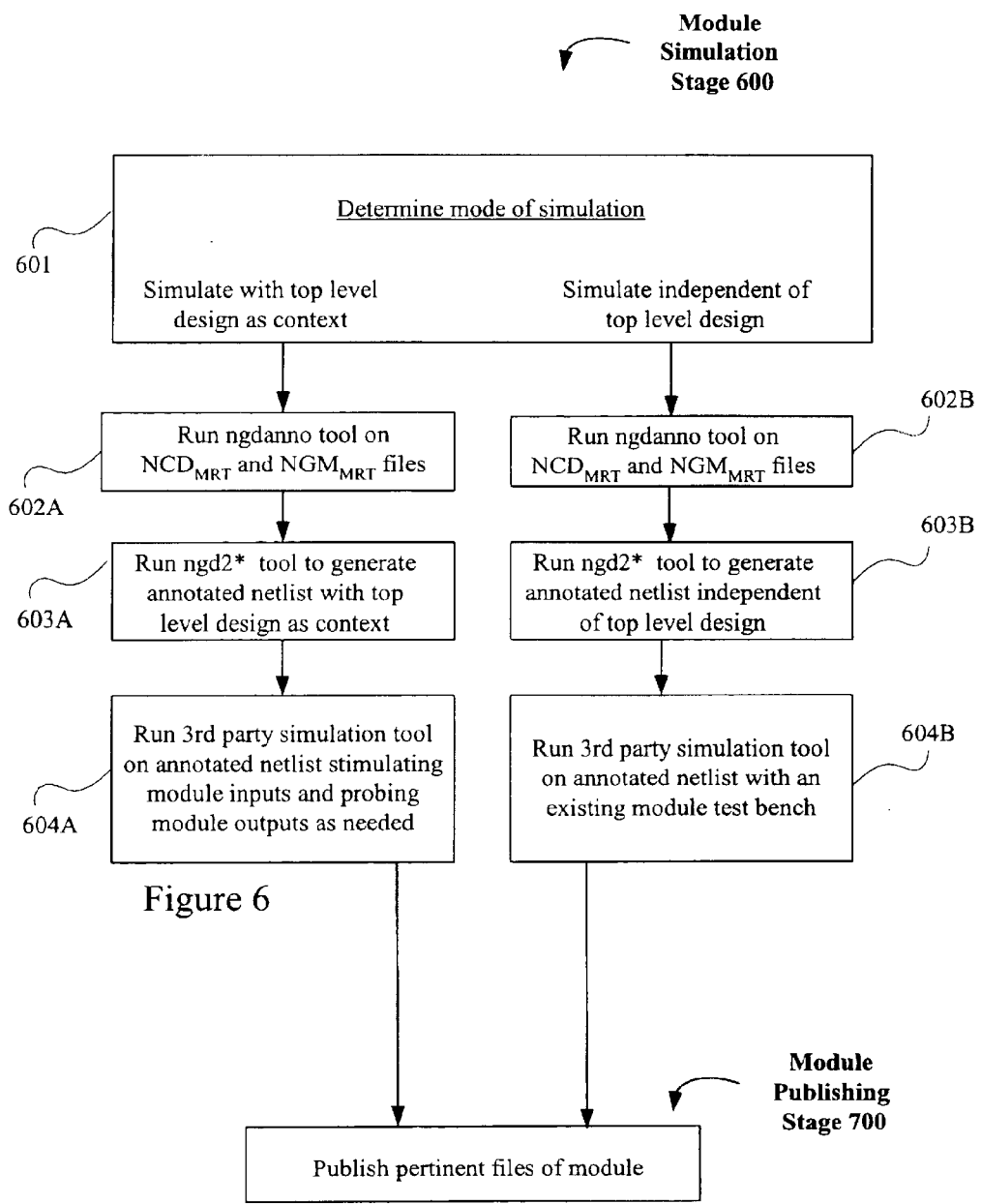
FIG. 6 illustrates an optional module simulation stage.
FIG. 7 illustrates a publishing stage.

FIG. 6: Module Simulation Stage 600

Simulation, if desired, can be done either using the top-level design as context or independent of the top-level design. Each mode of simulation has its own advantages and disadvantages. FIG. 6 shows a module simulation stage 600 in the modular design flow of the present invention. In step 601, the designer determines which mode of simulation will be used.

If the designer uses the top-level design as context, in step 602A, the back annotation tool (ngdanno) is run on the module-relative top-level NCD (top.ncd) and NGM (top.ngm) files (both in the ModA/ directory) to provide correlated (i.e. compared to the top.ngm file) back annotation. The commands to use the top-level design as context and run the back annotation tool are:

ngdanno-o top.nga <output ncd_filename>top.ngm ngd2edif-top.nga

The advantage of this mode is that the logic in the top-level design is included in the simulation. However, the inactive modules are still undefined. Therefore, an additional step 603A must be performed to run tools that annotate NGD files to an HDL source file to yield meaningful simulation results. Finally, in step 604A, the simulation tool is run, usually a 3rd party simulation tool, stimulating a broad range of module inputs and input combinations, and probing module outputs to assure that the module performs as desired.

If the designer simulates the module independent of the top-level design, in step 602B, the ngdanno tool is run on the module-relative top-level NCD (top.ncd) file in the ModA/ directory to provide back annotation only for the active module. The commands to simulate the module independent of the top-level design and run the back annotation tool are:

ngdanno-o mod.nga-module <output_ncd_filename>top.ngm ngd2edif-mod.nga

In the resulting simulation netlist, the top-level ports are those of the module itself. In step 603B, this netlist is then instantiated in a test bench that exercises just the active module. As in step 603A, an annotated netlist is generated, however when simulation is independent of the top level design, the annotated netlist is independent of the top level design. Finally, in step 604B, a simulation tool is run on this annotated netlist, usually with an existing module test bench.

For both modes of simulation, after module simulation stage 600, the design flow proceeds to module publication stage 700.

FIG. 7: Module Publication Stage 700

In accordance with the present invention, an implemented module (for example, module A) is published back to a centralized location. This centralized location, called a Physically Implemented Module (PIM) directory, is created specifically for modular assembly. This PIM directory is distinct from the module directory in which the module was implemented as well as from the top-level design directory. Specifically, the PIM directory is a writable directory accessible to all designers, whereas the module and top-level design directories are not meant to be write-accessible other than by their designers.

In the module publishing stage 700 of FIG. 7, a pimcreate tool is run in the module (ModA/) directory to publish the pertinent files into a subdirectory (A/) of the PIM directory. The publish operation will copy and rename these files as necessary to make them useable for later guide operations. Specifically, the module-relative top-level NGM (top.ngm) and NCD (top.ncd) files in the ModA/directory are renamed A.ngm and A.ncd files, respectively, in the subdirectory A/ of the PIM/ directory. The module level NGO (A.ngo) file is also published to the PIM/directory. As noted previously, the A.ngo file does not include any of the timing or other constraints that might have been added by the user during module implementation. The command used to publish files back to the PIM/directory (assuming the path to the directory is "pim_path") is:

pimcreate pim_pancd output_ncd_filename

The publishing step of FIG. 7 occurs for each module. If all modules have been published, then at this point the implementation information for all modules now exists in subdirectories of the PIM/ directory and the process proceeds to the final implementation stage 800.

The present invention ensures optimal flexibility in the design process. For example, an HDL Editor can be used to create additional logic in the top-level design before, during, or after module implementation. However, if additional logic is created after module implementation, then each of the modules should be referenced as an "unelaborated cell". At this point, the HDL Editor must generate a new top-level EDIF (top.edn) and NCF (top.ncf) files for the TOP/ directory. However, because any additional logic may adversely affect the optimization of one or more modules, creating additional logic is preferably done before module build stage 200.

Assembly Phase

The assembly phase, which includes a final implementation stage, implements the top-level design while referencing certain module "guide" files. The term "guide" in the present description refers to instructions that provide sufficient information for a process to proceed while minimizing information which may result in module conflict.

Figure 8A:
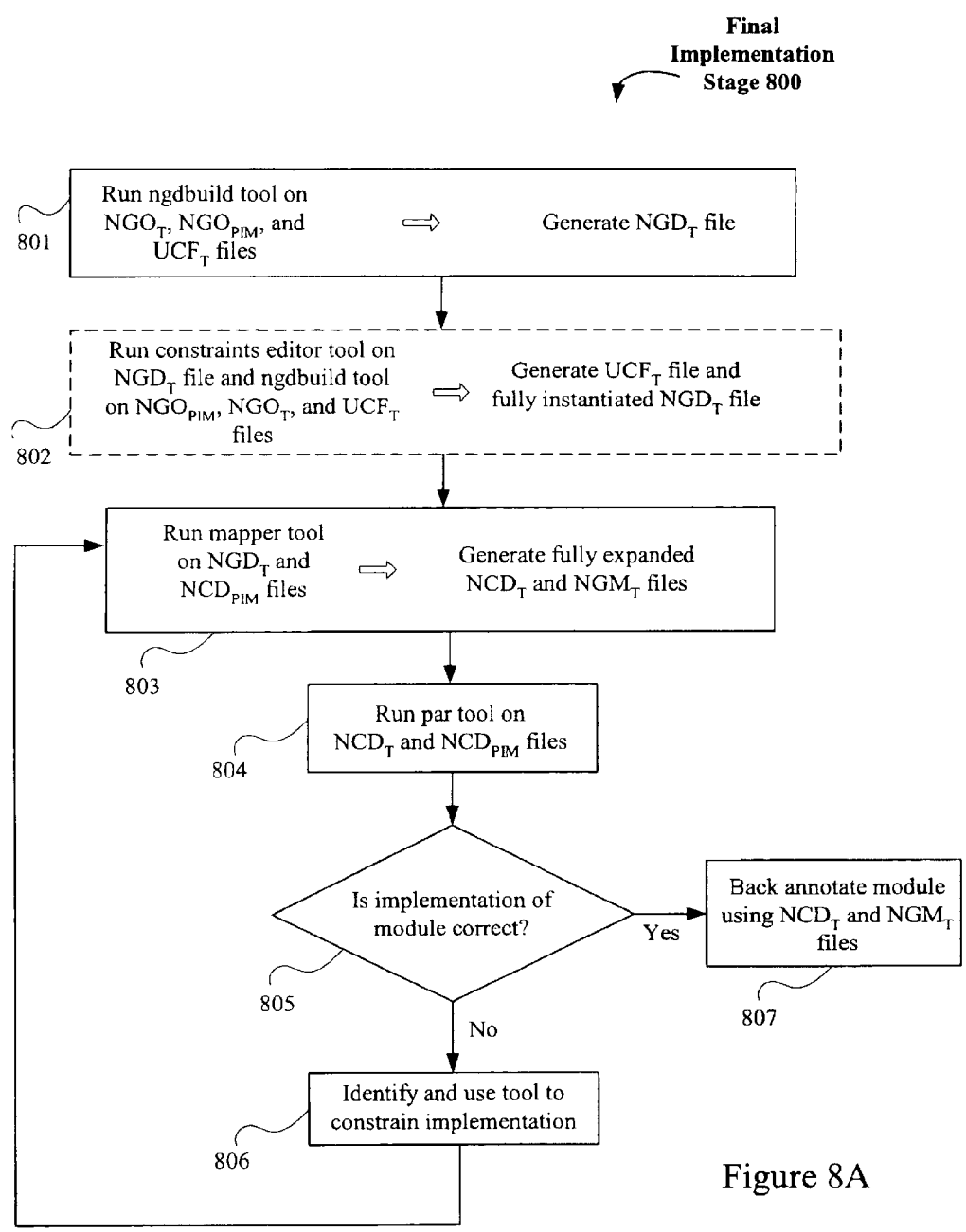
FIG. 8A illustrates a final implementation stage.

FIG. 8A: Final Implementation Stage 800

Figure 8B:
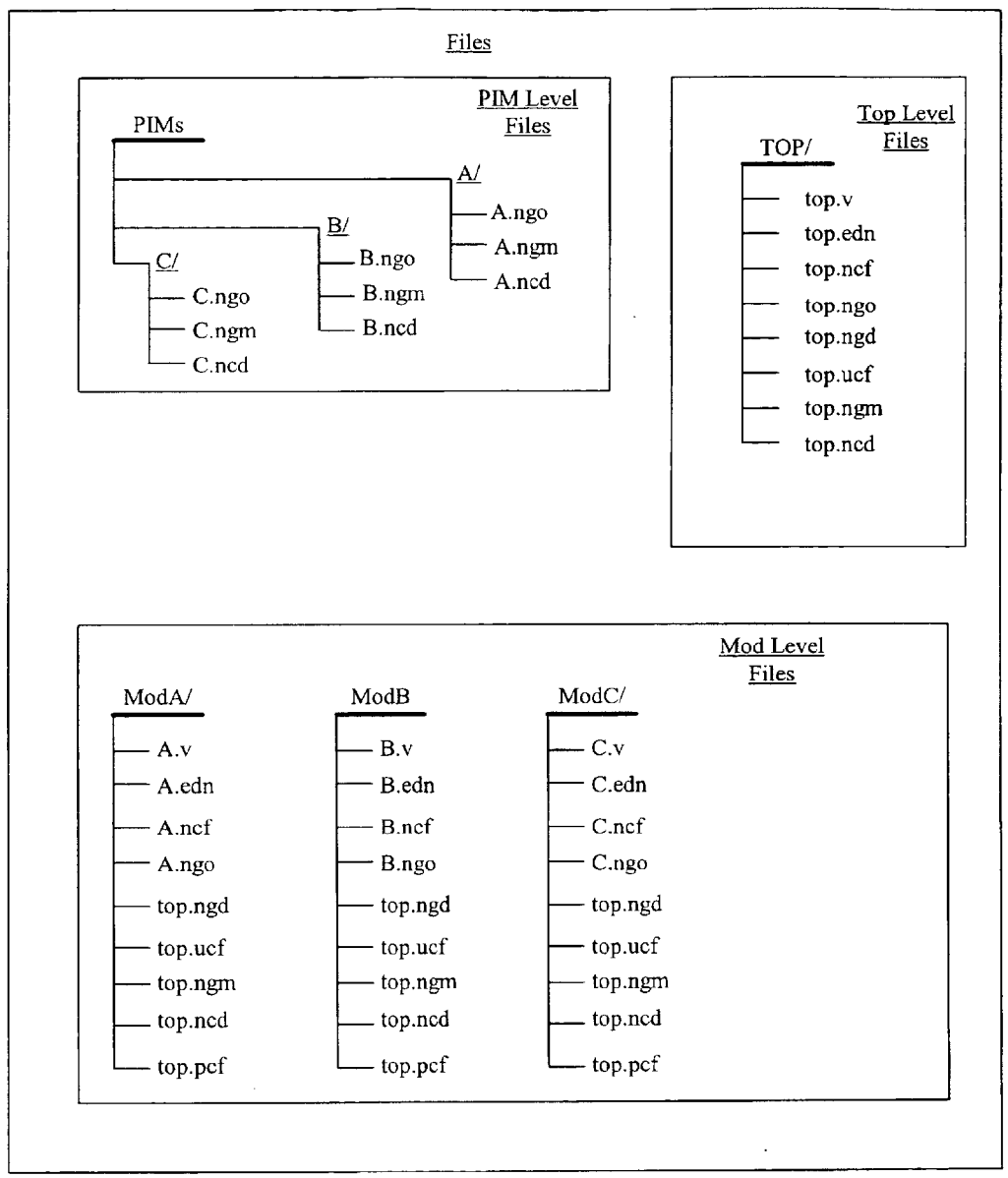
FIG. 8B illustrates files corresponding to the final implementation stage, including files for modules A, B, and C directories, the PIM directory, and the top-level directory.

The goal of the final implementation stage 800 is to generate a complete design from the information created in the initial design phase (stage 100) and the active module phase (stages 200–700). Although the final implementation stage 800 can be performed before all modules are published, thereby providing some validation of the design flow process, this stage is typically performed (and provides the most useful information to the designer(s)) after all modules are published. FIG. 8B illustrates the top-level, module level, and PIM level files assuming three modules (A, B, and C) are published.

The ngdbuild tool can be used to assemble all of the modules in the top-level design. An "assemble" argument to the "-module" switch identifies the assembly phase to the ngdbuild tool. Specifically, in step 801, a command ngdbuimodular assembpim_path pim_path
-use_pim mouse_pim mouse_pim modc top.ngo triggers the ngdbuild tool to run on the PIM level NGO (A.ngo, B.ngo, and C.ngo) files for each of the implemented modules as well as the top-level NGO (top.ngo) and UCF (top.ucf) files. Using these files, the ngdbuild tool can generate a new top-level NGD (top.ngd) file. Note that none of the NGO files contains any pseudo logic. Therefore, at this point, any vestige of pseudo logic in the design flow disappears and all ports in the top-level design are connected to specific IOBs or other resources, such as modular logic (i.e., logic in the module), in the top-level design.

In one embodiment, because all modules (i.e. modules A, B, C) are now fully elaborated, at this point timing constraints which reference logic internal to each module can be added. Therefore, in optional step 802, the constraints editor tool is run on the top-level NGD (top.ngd) file to identify any global timing constraints which might apply to the new top.ngd file, thereby generating a new top-level UCF (top.ucf) file. Then, the ngdbuild tool is rerun on the NGO files (PIM and top-level) and the top-level UCF (top.ucf) file to annotate these constraints into the top-level NGD (top.ngd) file. However, these additional constraints might cause problems during subsequent steps in which information generated without these constraints is used as a guide. Therefore, in a preferred embodiment, the design flow proceeds from step 801 directly to step 803.

In step 803, a command map top.ngd <other_map_flags> triggers the mapper tool to run on the top-level NGD (top.ngd) file in the TOP/ directory (the "<other_map_flags>" argument can be any of the currently supported flags). In this embodiment, the mapper tool notes that the top.ngd file instantiates three modules (A, B, C). In accordance with the present invention, the mapper tool is "guided" by the PIM level NGM (A.ngm, B.ngm, C.ngm) and NCD (A.ncd, B.ncd, C.ncd) files in the PIM/directory. This "guiding" allows any top-level constraints that might need to be pushed into module implementation to be correctly processed. Note that the A.ngm, B.ngm, and C.ngm files in the PIM/ directory include the pseudo logic that was added during module mapping stage 300, but the mapper tool ignores this pseudo logic because there are no corresponding blocks in the top-level NGD (top.ngd) file. The mapper tool generates a warning if any of the information cannot be 100% guided. Otherwise, the mapper tool generates fully elaborated top-level NCD (top.ncd) and NGM (top.ngm) files.

After final mapping, in step 804, a command par top.ncd top_impl.ncd <additional_par_flags> triggers the PAR tool to run on the top-level NCD (top.ncd) file. As noted previously, the "<additional_par_flags>" argument includes any of the currently supported par flags. The name "top_impl" is assigned to the output file of the PAR tool.

Upon startup, the PAR tool notes that the top-level NCD (top.ncd) file in the TOP/ directory instantiates three modules (A, B, C). In accordance with the present invention, the PAR tool is also "guided" by the PIM level NCD (A.ncd, B.ncd, and C.ncd) files in the PIM/ directory. The "guiding" enables certain tool optimizations (although not across module boundaries) to be performed that can increase the quality of the final design. Guiding may be performed as described by Parlour in U.S. Pat. No. 5,867,396, incorporated herein by reference. One such tool optimization may include identifying common signals going into various modules, thereby reducing the number of distinct signals and allowing the tools to run faster. Another optimization may include connecting a port to a voltage source if the port is supposed to receive a predetermined, constant logic signal. Note that these tool optimizations become apparent only when the implemented modules are being assembled. After the guide information has been processed, the PAR tool proceeds to place and route the top-level design in a standard manner.

After placing and routing, it is possible that resource contention may occur between the modules even though their assigned areas do not overlap. For example, contention may arise due to the modules, use of global logic or routing resources. In other instances, even though each module meets its own timing constraints, the top-level design will not meet its timing specification due to additive delays. Therefore, if the design is not correctly implemented or fails to meet user timing requirements as determined in step 805, then a user-determined tool is identified and used in step 806 to more fully constrain the implementation.

For example, if the design defects are relatively serious, then the user can use the floorplanner tool. Note that although all internal module logic is available to be floorplanned at this point, changes to this logic might invalidate future attempts to re-guide the implementation and therefore are not recommended. On the other hand, if the design defects are relatively minor, then the user can use a tool named fpga_editor, known by those skilled in the art of PLDs, which can manipulate individual CLBs and routing resources. Note that using the fpga editor tool also is not without risk and can result in the loss of information between synthesis and placing steps. Therefore, any changes to the logic should be carefully evaluated before implementing. After using the identified tool, the design flow returns to step 803 to correctly regenerate the top-level NCD and NGM files.

After the design is correctly implemented as determined by step 805, in step 807 the back annotation and simulation programs are run on top-level $NCD_T$ (top.ncd) and $NGM_T$ (top.ngm) files. Because the top-level design is now fully implemented and instantiated, back annotation and simulation programs can be run in a standard manner.

After back annotation and simulation are complete, standard tools can be used in conjunction with the top-level $NCD_T$ (top.ncd) file to generate, download, and debug the resultant configuration bitstream.

Pseudo Logic

As discussed above, in accordance with the present invention, pseudo logic is added to the unconnected port nets of the active module during module map stage 300. pseudo logic may include temporary drivers, loads, and tristate buffers (TBUFs). The following sections describe in detail the rules for adding pseudo drivers, pseudo loads, pseudo TBUFs, and dealing with multiple ports connected to the same net.

Note that although key value pairs, known as environment variables (ENVARs), may be used during the development phase to alter the default behavior of the mapper, the final implementation will not require having to set any environment variables. As known by those skilled in the art, an ENVAR allows a tool to be used in a different manner in different windows. Thus, for example, in a first window, a first ENVAR would cause the mapper tool to map in a first manner, whereas in a second window, a second ENVAR would cause the mapper tool to map in a second manner. Note that an ENVAR can apply to any tool in any window. Moreover, in regards to any pseudo logic described below, certain defaults may be provided that determine how each type of pseudo logic is created and/or modified using ENVARs or command line switches. These default mechanisms are well known to those skilled in the art and therefore are not described in detail herein.

Pseudo Drivers

A pseudo driver (flip-flop) is added to an IN port whenever the port net does not have a context driver. In this disclosure, context logic is the logic outside the modules at the top-level. Any locate (LOC) constraint on the port net is transferred to the pseudo driver. Note that if the IN port has a driver within the module, then a pseudo driver is not added to the port net, but a warning is issued.

Pseudo Loads

A pseudo load (buffer) is added to an OUT port whenever the port net has no context loads. Any LOC constraint on the port pin is transferred to the pseudo load.

Pseudo Tristate Buffers

Any OUT or bi-directional (BI) port with a tristate buffer (TBUF) driver within the module is referred to as a TBUF port. A pseudo TBUF is added to a TBUF port whenever there are no context TBUFs driving the port net. Any LOC constraint on the port pin is transferred to the pseudo TBUF.

Note that if a context TBUF exists it is assumed that it will be LOC'ed or floorplanned to ensure its appropriate location. Specifically, in certain PLD architectures such as the Virtex™ chip provided by Xilinx, Inc., tristate buffers must be in the same row or column in the routing banks to work correctly.

In one embodiment of the present invention, the tristate buffers are placed in the top-level design during the initial budgeting stage 100 and no tristate buffers are placed in the modules. In this manner, the software tools can automatically place the tristate buffers in the appropriate row or column, thereby eliminating any designer error associated with context tristate buffers.

In addition to the pseudo TBUF, a pseudo load is added to the TBUF port if there is no context load connected to the port net.

Handling Multiple Nets

The following sections describe how pseudo logic is added when there are multiple ports connected to the same net.

Multiple OUT Ports

If a net with a single driver within a module is connected to multiple OUT ports, then the mapper generates an error.

Multiple TBUF Ports

If there are multiple TBUF ports connected to a net, then the mapper generates an error.

Multiple IN Ports

The mapper generates an error if there are multiple IN ports connected to the same net. Although pseudo loads are not an ideal interpretation of IN ports, the pseudo loads provide sufficient ability to locate multiple IN ports connected to the same net. If the port net does not have a context driver or a driver within the module, then an un-LOC'ed pseudo driver is added to the port net.

IN Port and TBUF Port

If both an IN port and a TBUF port are connected to the same net, then the pseudo TBUF and the pseudo load corresponding to the TBUF port are added to the net.

However, the pseudo driver corresponding to the IN port is not added.

IN Port and OUT Port (Driver Within Module)

If both an IN port and an OUT port are connected to the same net, and the port net has a driver within the module, then only the pseudo load corresponding to the OUT port is added to the port net. The pseudo driver corresponding to the IN port is not added.

IN Port and OUT Port (Route Through)

If both an IN port and an OUT port are connected to the same net, and the port net has no driver, either within the module or in the context, then both a pseudo driver and a pseudo load are added to the port net.

The pseudo driver and pseudo load can be LOC'ed to opposite sides of the module to reserve resources for a route through the module.

Out Port and TBUF Port

If an OUT port and a TBUF port are connected to the same net, then the net has both a TBUF and non-TBUF driver within the module (this situation will generate an error).

TPSYNC Constraints

A TYPSYNC constraint is typically used to mark a given piece of logic so that it will not be collapsed out of the final design. This allows for other timing paths to be specified relative to this logic. In one embodiment of the present invention, at step 203 any TPSYNC constraint attached to a module port is attached to the module port net by the ngdbuild tool if present in the UCF file. In step 301, this TPSYNC constraint is then propagated to any pseudo logic connected to the port net using the following rules:

1. If pseudo loads are added to a port net, then the TPSYNCs are copied from the port net to each pseudo load.

2. If TPSYNCs are not copied to pseudo loads and there is a pseudo driver added to the port net, then the TPSYNCs are copied from the port net to the pseudo driver.

3. If TPSYNCs are not copied from the port net to the pseudo logic, then a warning is issued stating that the TPSYNCs are being ignored.

4. If a port net is connected to multiple IN ports (and there are no OUT or TBUF ports), then a single pseudo driver and multiple pseudo loads are added. In this case, the TPSYNCs are copied to the pseudo driver.

Assuming there are no context drivers or context loads connected to a module port net, the TPSYNCs are propagated in the following manner:

1. For a single IN port, add the pseudo driver and propagate the TPSYNC from the module port net to the pseudo driver.

2. For a single OUT port, add the pseudo load and propagate the TPSYNC from the port net to the pseudo load.

3. For a single TBUF port, add the pseudo TBUF, add the pseudo load, and propagate the TPSYNC to the pseudo load. (Note that the TPSYNC is not propagated to the pseudo TBUF.)

4. For multiple OUT ports, add multiple pseudo loads and propagate the TPSYNC to each pseudo load.

5. For multiple TBUF ports, add the pseudo TBUF, add the pseudo load, and propagate the TPSYNC to the pseudo load. (Note the TPSYNC is not propagated to the pseudo TBUF.)

6. For multiple IN ports, add the pseudo driver, add the multiple pseudo loads, and propagate the TPSYNC to the pseudo driver.

7. For a situation including both an IN port and a TRI port, add the pseudo TBUF, add the pseudo load, and propagate TPSYNC to pseudo load.

8. For a situation including both an IN port and an OUT port (driver within module), add the pseudo load and propagate the TPSYNC to the pseudo load.

9. For a situation including both an IN port and an OUT port (route through), add the pseudo driver, add the pseudo load, and propagate the TPSYNC to the pseudo load.

Modular Design Software Changes

A number of changes must be made to existing software systems to support the modular design flow described above in detail. These changes are described in reference to their associated tools and files.

For example, software changes affect the following tools: ngdbuild, mapper, par, ngdanno, floorplanner, and pimcreate.

Ngdbuild

The ngdbuild tool must include a command line switch to indicate a particular phase of modular design. All other tools, unless described hereinafter, will simply read information that has been placed into their respective input files. Each of the ngdbuild flags that are used with modular design are started with a "-modular" switch. This switch indicates that the ngdbuild tool is being used to process modules. Following the "-modular" switch is a flag indicating the current stage of modular design currently being executed. Following this stage indicator are optional sub-switches that specify the information needed to be passed into ngdbuild at that stage. The following command line arguments may be processed by the ngdbuild tool:

1. -modular=initial

Modular design in initial design phase.

2. -modular=moduactive=<active_module_name>

Modular design in active module phase. The "active_module_name" required argument to the "-active" sub-switch specifies the name of the active module. This name is used later by the mapper tool during the insertion of pseudo logic.

3. -modular=assembpimpath=<path>-use_pim
  =<pim-module_names>

Modular design in assembly phase. The "path" required argument to the "-pimpath" sub-switch indicates the path to the directory where all published PIMs reside. The ngdbuild tool uses this information to internally modify the Search Specified Directory (-sd) path (used in a standard manner) so that each PIM can be found. The ngdbuild tool needs to save this path information in the NGD file so that the mapper tool can later locate the associated PIM NGM/NCD files needed for guiding.

The "-pim module_names" required argument to the "-use im" sub-switch specifies the names of published PIMs that should be used during the assembly stage. Multiple "-use_pim" flags can be specified. All completed and published PIMs should be specified exactly as they were specified with tactive flag when they were implemented.

Note that the above equal signs are inserted for clarity to indicate which argument is associated with which flag. The actual command lines substitute spaces for the equal signs.

Mapper

Because the mapper tool is the first tool that knows the target architecture and can perform necessary modular design type operations, a number of critical changes from prior art mappers are made in this tool. The following items are implemented in the mapper tool:

1. Add pseudo logic

When the mapper tool is invoked on an NGD file that contains an active module (as set by ngdbuild), the mapper tool adds some special logic before mapping. This special logic, pseudo logic, is described above in detail. Pseudo logic is added so that the module can be implemented and manipulated in the floorplanner tool independent of the top-level design.

The addition of pseudo logic necessitates the pushing of "LOC" constraints that might have been previously placed on port nets onto any generated pseudo logic for that port. "TPSYNC" constraints are also pushed in the same manner.

Each piece of pseudo logic created by the mapper tool (unconstrained pseudo logic) and pseudo logic placed by the user (constrained pseudo logic) is marked in the resultant NCD file. In this manner, the pseudo logic can be easily identified and then ignored during the guiding operation. The mapper also indicates the name of the module in the resultant NCD file to identify the module during subsequent operations.

2. Architecture Guide

The mapper tool needs to support the full range of guide operations for the designated architecture.

3. Multiple Guide

The mapper tool needs to support multiple guide files in a single execution. When this is done, the mapper tool iteratively steps through each guide file and guides the logic corresponding to the logic in the guide file. Here, guiding comprises recreating all the steps necessary to generate physical PLD logic blocks just as they were previously created. Each physical piece of logic created from a guide file needs to be marked so that information from other guide files cannot affect its contents. This implies that no mapper optimization is performed across module boundaries.

4. Guide PIM information

When the mapper tool is invoked on an NGD file which instantiates one or more modules, as found in the new NGD file structure, the mapper tool needs to invoke its guide subroutine using the NCD/NGM file in each PIM directory. Any constraints which are found in the top-level NGD or UCF files are "pushed" into these guided pieces of logic in a standard manner. The name of each instantiated PIM and the path to the PIM directory are saved in the resultant NCD file for later processing.

Placer & Router (PAR Tool)

The following modifications are needed in the PAR code for modular design.

1. Place unconstrained pseudo logic

When the PAR tool reads an NCD file that has been marked by the mapper tool as representing an active module, the PAR tool first places any unplaced IOBs (as is typically done) and then places any unconstrained pseudo logic which may exist. (Recall that in this description, constrained pseudo logic is the logic manually placed by the user, and unconstrained pseudo logic is the pseudo logic added by the mapper (step 303) and not modified by the user.) This step is needed to fully place all logic at the perimeter of a module and interior logic constrained by the user before invoking the placer. Unconstrained pseudo logic should be placed on the outside of the range defined for the module. Recall that users will have manually placed constrained pseudo logic using the floorplanner in step 108, but the PAR tool will perform the actual placement of unconstrained logic.

2. Multiple Guide

The PAR tool needs to support multiple guide files supplied to it in a single execution. When this is done, the PAR tool iteratively steps through each one and guides the placement of the logic corresponding to the logic in the guide file. After each guide is complete, the logic just guided will be marked so that the next guide operation will not move this logic.

3. Guide PIM information

Once the PIM information exists in the NCD file from the mapper tool, the PAR tool needs to read this information from the NCD file and perform the same guide operations upon startup.

Annotation

The following items should be implemented in the back annotation tool, ngdanno.

1. Physical Simulation of a Module in Isolation

The ngdanno tool supports a new command line option,

-module which is only applicable when the ngdanno tool is given an NCD file containing a module implementation. Use of "-module" in conjunction with an NCD file that does not contain an active module results in a user error.

This "-module" switch triggers the ngdanno tool to create an NGA file based on the module in isolation. Therefore, at this point, all context and pseudo logic is removed from the design, and the top-level interface (i.e. ports) is constructed solely from module interface signals. The removal of pseudo loads (one type of pseudo logic) implies that the route delays from module outputs are no longer visible anywhere in the design. Therefore, route delays for module inputs are annotated to loads within the module.

2. Logical and Physical Simulation of a Module in Context

When the ngdanno tool is invoked on an NCD file containing a module without -module option, the ngdanno tool creates a simulation model including the entire top-level context plus the module (step 602A). Pseudo drivers are removed to prevent contention with simulated signals (i.e., stimulus) that the user is expected to provide at undriven module inputs (step 603A). Pseudo loads are also removed. Both logical (with NGM) and physical (without NGM) phases are preferably supported.

Floorplanner

The floorplanner tool implements some new functionality used in the initial budgeting stage. The addition of this functionality greatly aids developers in getting the initial module implementation specified correctly. The functionality and the changes necessary to provide the functionality are described below.

1. Read an NGD File

The floorplanner tool is changed to be able to read NGD and UCF files with unelaborated blocks (step 109). In the present invention, the floorplanner tool assumes that each unelaborated block is a module and displays this module as a black box on the screen. In one embodiment, the floorplanner tool recommends a size for the module. In another embodiment using the floorplanner tool, the user creates an initial rectangular size for each module and positions the module on the chip. In one embodiment of the floorplanner tool, the default location of pseudo logic is approximately on a straight line between ports in adjacent modules. However, the designer can establish other rules for locating pseudo logic or can manually position the pseudo logic to achieve desired results. If the designer has established rules for locating pseudo logic, the selected locations should all be reviewed for effectiveness in the design. The floorplanner tool outputs a single UCF file that contains any originally existing constraints along with some new range constraints.

Pimcreate Tool

The pimcreate tool is responsible for creating the files in a PIM directory from a set of module implementation files. Specifically, the pimcreate tool is run by the user to publish a completely implemented module back to the PIM directory (step 700). The pimcreate tool must receive a full pathname to a module directory and the desired output name as arguments. The following items are implemented using the pimcreate tool:

1. Create the NGO File in the PIM Directory

The NGO file is a copy of the module level NGO file from the module directory to the PIM directory.

2. Create the NGM file in the PIM Directory

The NGM file in the PIM directory is the top-level NGM file in the module directory renamed to be the module NGM file.

3. Create the NCD File in the PIM Directory

The NCD file in the PIM directory is the top-level NCD file in the module directory renamed to be the module NCD file.

Note that there are no other files created in the PIM directory.

The following files must change formats to store the above information. Corresponding changes are also made in the associated helper code related to accessing these files.

NGD File Format

The NGD file format and contents need to be modified to hold information that the ngdbuild and the mapper tools need when processing modules. These changes include:

1. State of Logical Design

The state of a logical design with respect to modular design is saved. This information includes:
   a. a list of the modules contained in the design;
   b. the "active" module (the module which is currently being implemented);
   c. the value of the "-pimpath" argument to ngdbuild that specifies the PIM directory;
   d. a design state designated as one of the following:
      (1) design: contains no modules
      (2) initial budgeting: design contains only inactive (empty) modules
      (3) module implementation: design contains a single active module, and may also contain any number of inactive modules (or even modules that are fully implemented in PIM)
      (4) design assembly: all modules in the design are fully implemented in PIM 2. Each module instance is an NGD file corresponding to a node in the logical hierarchy (wherein a logical hierarchy include a plurality of nodes interconnected in a predetermined manner). This node includes the following information:
   a. module name (the "cell" name of the module);
   b. an enumeration of module states designated as one of the following:
      (1) inactive (empty)
      (2) active
      (3) implemented (PIM);
   c. if PIM, then the full pathname to the PIM files can be constructed.

NGM File Format

This is identical to the changes in the NGD file since these are the same file formats along with some additional information. Since the NGM file contains the physical view information, this file includes properties on each logic element and each signal that indicate its state relative to modular design. Specifically, logic is pseudo (added by the mapper tool), context (part of an active module's context), or modular (part of the active module). Signals are "port_in" (module input), "port_out" (module output), "port_tri" (module tristate output), or "port_bi" (module bi-directional).

NCD File Format

The NCD file format is modified to include the following modular information:

1. the name of the active module contained therein if it exists;
2. the pointer to the PIM directory (the pointer being set by the mapper tool and used by the PAR tool to locate guide information); and 3. the list of instantiated module names (the list being set by the mapper tool when the NCD file is created using the information (i.e., the logic designations of pseudo, context, and module) provided in the module-relative NGD file (step 304), and used by the PAR tool for guiding when implementing a design which instantiates modules (step 804)).

Modular design for PLDs provides many advantages for logic designers, particularly as designs become more complex and time to production is shortened. Those skilled in the art will recognize various modifications that could be made to the above-described modular design flow to provide further advantages. For example, modular reuse, interface definition, and hierarchical databases could be used to avoid replicated information. These and other modifications are envisioned to be within the scope of the present invention, as defined by the appended claims.

What is claimed is:

1. A method for providing modular design in a programmable logic device, the method comprising:

partitioning a top-level logic design into a plurality of modules;

implementing each module using information generated by the partitioning step; and assembling the modules using information generated from the implementing step and the partitioning step, wherein the step of assembling includes mapping the top-level design using guide files generated during the step of implementing.

2. The method of claim 1 wherein the step of partitioning includes positioning any global logic outside the plurality of modules.

3. The method of claim 2 wherein the global logic includes at least one of the following resources: inputs/outputs, clock nets, a delay locked loop (DLL), and a random access memory (RAM).

4. The method of claim 2 wherein the global logic includes resources that are not evenly distributed across the programmable logic device.

5. The method of claim 1 wherein the step of partitioning includes sizing and positioning each module on the programmable logic device.

6. The method of claim 5 wherein the step of partitioning includes positioning pseudo logic for each module, wherein pseudo logic for a first module is positioned outside a boundary defined for the first module.

7. The method of claim 6 wherein the pseudo logic for the first module is positioned inside a boundary defined for an adjacent module.

8. The method of claim 1 wherein the step of partitioning includes creating a physically implemented module (PIM) directory.

9. The method of claim 1 wherein the step of partitioning includes publishing predetermined files to a centralized directory.

10. The method of claim 9 wherein the predetermined files include module level native generic object, top level netlist constraints database, and top level native generic mapped files for the module.

11. The method of claim 1 wherein the step of partitioning includes generating a first file comprising a description of the top-level logic design in primitive elements.

12. The method of claim 11 wherein the top-level first file comprises a tog-level EDIF file.

13. The method of claim 11 wherein the step of partitioning includes generating a second file comprising inter-module timing constraints for the top-level logic design.

14. The method of claim 13 wherein the second file comprises a top-level netlist constraints file (NCF).

15. The method of claim 13 wherein the step of partitioning includes using the first and second files to generate a third file comprising the description of the top-level logic design, a hierarchy of the top-level logic design, and any constraints of the first and second files.

16. The method of claim 15 wherein the third file comprises a top-level native generic object (NGO) file.

17. The method of claim 15 wherein the step of partitioning includes using the third file to generate a fourth file comprising the description of the top-level logic design, the hierarchy of the top-level logic design, and any constraints of the top-level logic design.

18. The method of claim 17 wherein the fourth file comprises a top-level native generic database (NGD) file.

19. The method of claim 17 wherein the step of partitioning includes using information in the fourth file to generate a fifth file that includes inter-module constraints of the top-level logic design.

20. The method of claim 19 wherein the fifth file further includes module-to-input/output constraints of the top-level logic design.

21. The method of claim 19 wherein the fifth file comprises a top-level user constraints file (UCF).

22. The method of claim 19 wherein the step of partitioning includes annotating the fourth file with information from the fifth file.

23. The method of claim 1 wherein the implementation of at least two modules is performed substantially in parallel.

24. The method of claim 1 wherein the implementation of the plurality of modules is performed in any order.

25. The method of claim 1 wherein the step of implementing includes implementing each module in a separate module directory.

26. The method of claim 1 wherein the top-level logic design provides context for the module implementation.

27. The method of claim 1 wherein position and size of all modules are used in implementation of each module.

28. The method of claim 1 wherein the top-level logic design includes positions of pseudo logic used for module implementation.

29. The method of claim 1 wherein the step of implementing includes mapping each module.

30. The method of claim 29 wherein mapping includes adding pseudo logic to any unconnected ports of at least one module.

31. The method of claim 30 wherein the pseudo logic is not implemented in the top-level logic design.

32. The method of claim 1 wherein the step of implementing includes adding pseudo logic to any unconnected port of the module.

33. The method of claim 1 wherein the step of implementing includes placing and routing each module.

34. The method of claim 33 wherein the step of placing includes placing any unconstrained pseudo logic, and then placing module logic in the module.

35. The method of claim 1 wherein the step of implementing includes floorplanning at least one module.

36. The method of claim 35 wherein floorplanning the module includes placing any pseudo logic, and then placing module logic.

37. The method of claim 35 wherein floorplanning comprises mapping, placing, and routing at least one module at a time.

38. The method of claim 1 wherein the step of implementing includes simulating each module.

39. The method of claim 38 wherein simulating is performed using the top-level logic design as context.

40. The method of claim 38 wherein simulating is performed independently from the top-level logic design.

41. The method of claim 38 wherein simulating the module includes simulating dangling signals of the module.

42. The method of claim 1 wherein the step of implementing includes publishing predetermined files for each module to a centralized directory.

43. The method of claim 42 wherein the centralized directory is a physically implemented module (PIM) directory.

44. The method of claim 19 wherein the step of implementing includes using the fifth file to generate a sixth file comprising user constraints associated with a module and the top-level design.

45. The method of claim 44 wherein the sixth file comprises a module-relative top-level user constraints file (UCF).

46. The method of claim 44 wherein the step of implementing includes generating a seventh file comprising a description of the module in primitive elements.

47. The method of claim 46 wherein the seventh file comprises a module-level EDIF file.

48. The method of claim 46 wherein the step of implementing includes generating an eighth file comprising constraints for the module.

49. The method of claim 48 wherein the eighth file comprises a module-level netlist constraints file (NCF).

50. The method of claim 48 wherein the step of implementing includes using the seventh and eighth files to generate a ninth file comprising the description of the module, a hierarchy of the module, but no constraints of the module.

51. The method of claim 50 wherein the ninth file comprises a module-level native generic object (NGO) file.

52. The method of claim 50 wherein the step of implementing includes using the third, sixth, and ninth files to generate a tenth file comprising the description of the module and the top-level design, the hierarchy of the module and the top-level design, and any constraints of the module and the top-level design.

53. The method of claim 52 wherein the tenth file comprises a module-relative top-level native generic database (NGD) file.

54. The method of claim 52 wherein the step of implementing includes using information in the tenth file to add intra-module timing constraints to the sixth file.

55. The method of claim 52 wherein the step of implementing includes annotating the tenth file with information from the sixth file.

56. The method of claim 52 wherein the step of implementing includes mapping the tenth file.

57. The method of claim 52 wherein the step of implementing includes generating an eleventh file comprising a physical design database of the module in the context of the top-level design.

58. The method of claim 57 wherein the eleventh file comprises a module-relative top-level netlist circuit description (NCD) file.

59. The method of claim 57 wherein the step of implementing includes generating a twelfth file comprising the description and mapping of the module in the context of the top-level design, the hierarchy of the module and the top-level design, and any constraints of the module and the top-level design.

60. The method of claim 59 wherein the twelfth file comprises a native generic map file.

61. The method of claim 57 wherein the step of implementing includes placing and routing the eleventh file.

62. The method of claim 1 wherein the step of assembling including placing and routing the top-level design using guide files.

63. The method of claim 1 wherein the step of assembling includes using a module native generic object file for any modules in a public directory of module physical implementations, a top-level native generic object file, and a top level user constraints file to assemble a top-level native generic database file comprising the description of any modules in the top-level design, the hierarchy of any modules in the top-level design, and any constraints of any modules in the top-level design.

64. The method of claim 1 wherein the step of assembling includes using a plurality of top-level netlist circuit description files and one top-level native generic database file to assemble a physical design database of any modules in the top-level design.

65. The method of claim 64 wherein the physical design database comprises a new, top-level netlist circuit description (NCD) file.

66. The method of claim 64 wherein the step of assembling includes using a plurality of top-level netlist circuit description files and one top-level native generic database files to generate a top-level native generic mapped file comprising the description end mapping of any modules and the top-level design, the hierarchy of any modules and the top-level design, and any constraints of any modules and the top-level design.

67. The method of claim 66 wherein the step of assembling includes using the plurality of top-level netlist circuit description to fully implement the top-level design.

68. A method for providing modular design for a logic design including multiple modules, the method comprising:

generating a set of top-level file for the logic design in a top-level directory;

copying portion of the first set of top-level files to a plurality of module directories, each module directory for implementing a single module:

generating a set of module-relative top-level files for each module using the portion of the set of top-level files;

mapping, placing, and routing each module in its respective module directory;

publishing a portion of the set of module-relative top-level files from each module directory to an implementation directory; and implementing the logic design in the top-level directory by accessing the set of module-relative top-level files in the implementation directory.

69. A method comprising:

creating a top-level design including unelaborated modules;

generating at least one top-level file for the top-level design;

using the at least one top-level file to implement each unelaborated module end to generate a module-relative top-level file for each implemented module; and assembling the implemented modules using the module-relative top-level file of each module.

70. A method of implementing a logic design in a programmable logic device, the method comprising:

dividing the logic design into a plurality of modules;

building each module based on information generated during the step of dividing;

mapping each module based on information generated during the step of building;

placing and routing each module;

assembling predetermined files associated with any place and routed modules; and mapping, placing, and routing the logic design using the assembled predetermined files.

71. A method for generating configuration data which implements logic included in a programmable logic device, comprising the following steps:

providing a top-level design including a plurality of unelaborated modules;

generating a top-level file for the top-level design;

using the top-level file to build each unelaborated module and to generate a module-relative top-level file for each built module;

using the module-relative top-level file of each module to assemble the built modules; and generating an output file including the assembled, built modules, wherein the output file provides the configuration data for the programmable logic device.

72. A method for providing modular design in a programmable logic device, the method comprising:

partitioning a top-level logic design having a plurality of paths into a plurality of modules, each of the modules having a plurality of ports for connecting to other modules, wherein each module is placed and routed independently of the other modules in the design; and implementing the modules such that all the ports are registered, whereby critical paths in the design are all inside a module.

* * * * *